US012784852B2

(12) United States Patent
Hwu et al.

(10) Patent No.: US 12,784,852 B2
(45) Date of Patent: Nov. 3, 2026

(54) MEMORY DEVICE AND METHOD FOR OPERATING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jenn-Gwo Hwu, Taipei City (TW); Sung-Wei Huang, Hsinchu City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 178 days.

(21) Appl. No.: 18/490,234

(22) Filed: Oct. 19, 2023

(65) Prior Publication Data

US 2025/0131967 A1 Apr. 24, 2025

(51) Int. Cl.
*G11C 17/18* (2006.01)
*G11C 17/16* (2006.01)
*H10B 20/25* (2023.01)

(52) U.S. Cl.
CPC .............. *G11C 17/18* (2013.01); *G11C 17/16* (2013.01); *H10B 20/25* (2023.02)

(58) Field of Classification Search
CPC ...................................................... G11C 17/18
USPC ............................................................ 365/96
See application file for complete search history.

(56) References Cited

U.S. PATENT DOCUMENTS

2006/0073642 A1* 4/2006 Yeh ..................... G11C 11/5692 438/467
2014/0241031 A1* 8/2014 Bandyopadhyay .. H10N 70/063 365/96
2023/0223062 A1* 7/2023 Lee ..................... G11C 11/1673 365/96

OTHER PUBLICATIONS

Chang et al., Investigation of Two Bits With Multistate Antifuse on nMOS Poly-Silicon Junctionless 1 GAA OTP', IEEE Transactions on Electron Devices, vol. 68, No. 12, Dec. 2021, pp. 6118-6123.*
Chen et al., Multilevel Anti-Fuse Cells by Progressive Rupturing of the High-x Gate Dielectric in FinFET | Technologies, IEEE Electron Device Letters, vol. 37, No. 9, Sep. 2016, pp. 1120-1122.*

(Continued)

*Primary Examiner* — Muna A Techane
(74) *Attorney, Agent, or Firm* — Birch, Stewart, Kolasch & Birch, LLP

(57) ABSTRACT

A method for forming a memory device is provided. The method includes forming first and second metal-insulator-semiconductor (MIS) structures, wherein each of the first and second MIS structures comprises a semiconductor layer, an insulating layer over the semiconductor layer, and a metal electrode layer over the insulating layer; performing a first breakdown process to the first MIS structure; performing a second breakdown process to the second MIS structure; performing a first read operation by supplying a reading voltage pulse to the metal electrode layer of the first MIS structure and detecting a first read current flowing through the first MIS structure; and performing a second read operation by supplying the reading voltage pulse to the metal electrode layer of the second MIS structure and detecting a second read current flowing through the second MIS structure, wherein the second read current is greater than the first read current.

20 Claims, 29 Drawing Sheets

(56) References Cited

OTHER PUBLICATIONS

Gorriz et al., Application of the Clustering Model to Time-Correlated Oxide Breakdown Events in Multilevel Antifuse Memory Cells, IEEE Electron Device Letters, vol. 41, No. 12, Dec. 2020, pp. 1770-1773.*

Yang et al., Gate Oxide Local Thinning Mechanism-Induced Sub-60 mV/Decade Subthreshold Swing _ on Charge-Coupled MIS(p) Tunnel Transistor, IEEE Transactions on Electron Devices, vol. 66, No. 1, Jan. 2019, pp. 279-285.*

Chang et al., "Investigation of Two Bits With Multistate Antifuse on nMOS Poly-Silicon Junctionless GAA OTP", IEEE Transactions on Electron Devices, vol. 68, No. 12, Dec. 2021, pp. 6118-6123.

Chen et al., "Multilevel Anti-Fuse Cells by Progressive Rupturing of the High-κ Gate Dielectric in FinFET Technologies", IEEE Electron Device Letters, vol. 37, No. 9, Sep. 2016, pp. 1120-1122.

* cited by examiner

MEMORY DEVICE AND METHOD FOR OPERATING THE SAME

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
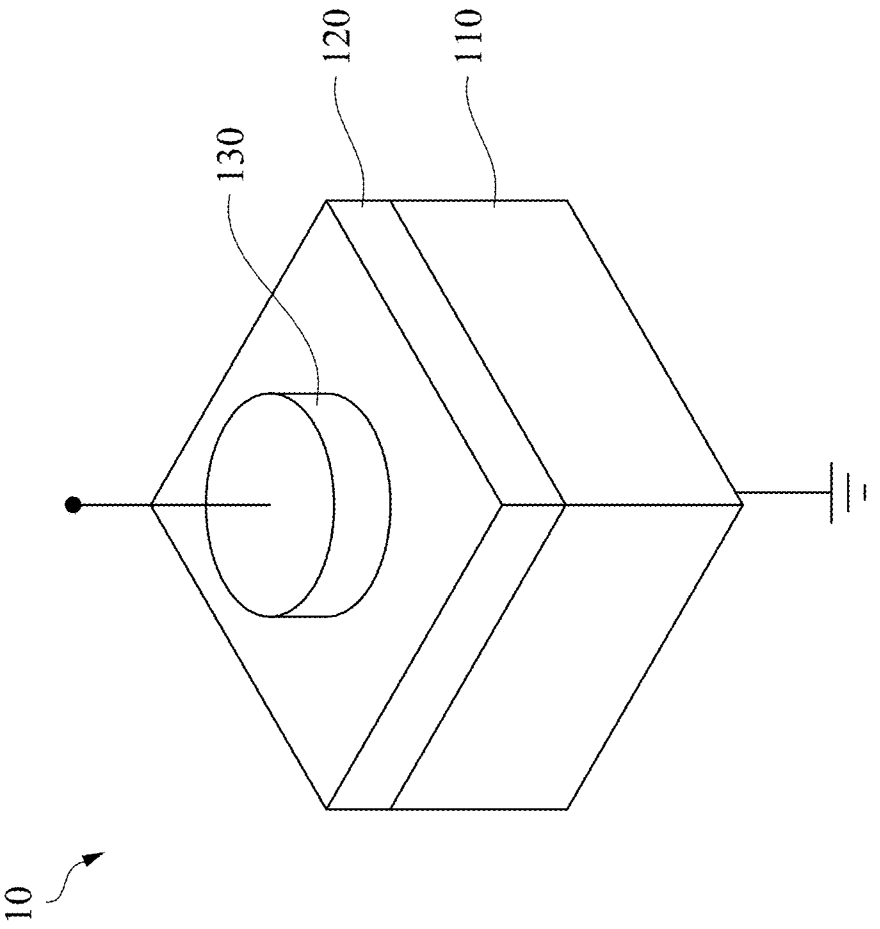
FIG. 1 is a schematic view of a metal-insulator-semiconductor (MIS) structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One Time Programmable (OTP) Memory devices are essential in modern IC industry, especially in circuit security and encryption key. An OTP cell is non-volatiled and could be programmed only one time. Antifuse is a kind of OTP memory which stores '0' when unprogrammed and '1' when programmed. Generally, hard breakdown on the dielectric is used to program an antifuse. According to embodiments of the present disclosure, a multi-level antifuse is developed by performing polarity dependent dielectric breakdown on MIS device for addressing the increasing demand of data storage.

FIG. 1 is a schematic view of a metal-insulator-semiconductor (MIS) structure in accordance with some embodiments of the present disclosure. Shown there is a MIS structure 10. The MIS structure 10 includes a semiconductor layer 110, an insulating layer 120 over the semiconductor layer 110, and a metal electrode layer 130 over the insulator layer 120. In some embodiments, the metal electrode layer 130 can also be referred to as a top gate. In some embodiments, the MIS structure 10 can also be referred to as a MIS cell.

In some embodiments, the semiconductor layer 110 may be made of Si, Ge, GaAs, $MoS_2$, or other suitable semiconductor material. The semiconductor layer 110 may be a p-type semiconductor layer or an n-type semiconductor layer. The semiconductor layer 110 may be a bulk semiconductor substrate, can be optionally doped. For example, the semiconductor layer 110 can be a p-type semiconductor layer or an n-type semiconductor layer. The insulating layer 120 may be made of dielectric material, such as silicon oxide ($SiO_2$), aluminum oxide ($Al_2O_3$), hafnium oxide ($HfO_2$), hBN, or other suitable dielectric material. The metal electrode layer 130 may be made of polysilicon or metal, such as aluminum (Al), titanium nitride (TiN), gold (Au), tungsten (W), or other suitable metal. The metal electrode layer 130 may include suitable top profile, such as a circular shape in this case, while other profiles, such as rectangular shape, may also be employed. In some embodiments, a gate voltage $V_G$ may be applied onto the metal electrode layer 130 for programing the MIS structure 10, and the p-type silicon substrate 110 may be electrically connected to a ground potential. Breakdown (BD) events happen by applying a suitable gate voltage $V_G$ on the metal electrode layer 130.

Figure 2C:
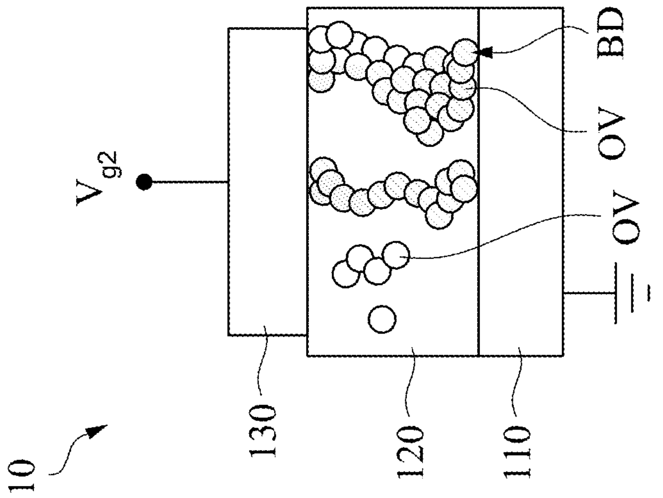
FIGS. 2A, 2B, and 2C are cross-sectional views of a MIS structure in accordance with some embodiments of the present disclosure.
Figure 2B:
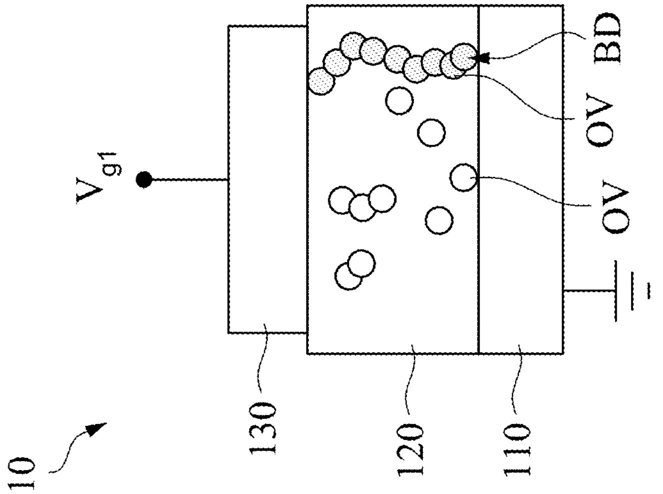
Figure 2A:
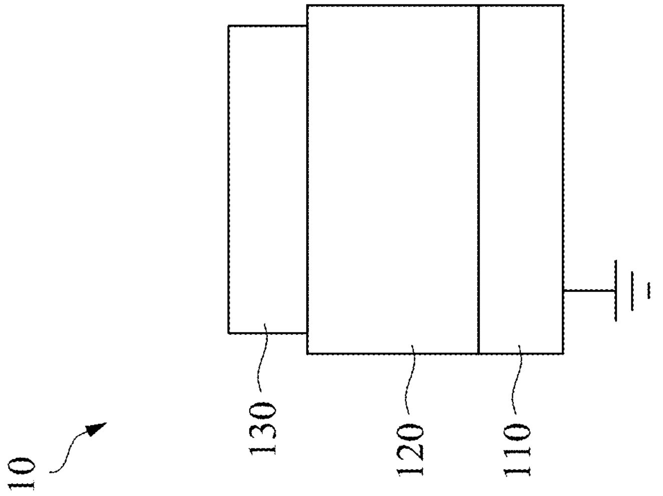

FIGS. 2A, 2B, and 2C are cross-sectional view of a MIS structure 10 in accordance with some embodiments of the present disclosure. In FIG. 2A, few oxide traps are in the insulating layer 120. In some embodiments, the severity of breakdown by stressing with selected polarity in bias and the subsequently different tunneling currents to define multi-states. In some embodiments, a single-layered insulating layer 120 is in MIS capacitor, and three stable states could present.

FIG. 2A is a condition of the MIS structure 10 prior to performing a breakdown process, in which no bias is applied to the MIS structure 10. With little or no breakdown in the insulating layer 120, the MIS structure 10 of FIG. 2A can be referred to as a "fresh" or "State 0".

In FIG. 2B, a first-state breakdown process is performed to the MIS structure 10 by applying a first-polarity voltage $V_{g1}$ to the metal electrode layer 130 to induce a reverse bias of the MIS structure 10. In some embodiments, the first-polarity voltage $V_{g1}$ supplied to the p-type MIS structure 10 may cause the semiconductor layer 110 under a deep depletion regime. In the embodiments where the MIS structure 10 is formed with the p-type silicon substrate 110, the first-polarity voltage $V_{g1}$ may be a positive voltage stress (PVS), such as a ramped PVS, a constant positive voltage level, a positive current weep, or a constant positive current stress. In some alternative embodiments where the MIS structure 10 is formed with the n-type silicon substrate 110, the first-polarity voltage $V_{g1}$ may be a negative voltage stress (NVS), such as a ramped NVS, a constant negative voltage level, a negative current weep, or a constant current stress. Under the first-polarity voltage $V_{g1}$, traps will generate within the oxide, thereby forming oxide traps/vacancies OV. Plural oxide traps/vacancies OV may form a local conductive percolation path, which is also referred to a BD path.

In some embodiments of the present disclosure, the formation of the BD path by the first-polarity voltage $V_{g1}$ is considered and evidenced as self-protective. The tunneling current is limited by generation in p-type silicon (or n-type silicon). Moreover, once a single breakdown spot has formed, electrons/inversion charges in Si(p) (or Si(n)) would leak out, and the voltage drop on oxide would be smaller than that before breakdown. No further breakdown event would happen under this positive stress, and this therefore can be considered as self-protective. Stated differently, in some embodiments, under the first-polarity voltage $V_{g1}$, once a BD path is formed, no further BD will happen. With a BD path in the insulating layer 120, the MIS structure 10 of FIG. 2B can be referred to as a "State 1".

In FIG. 2C, after the first-state breakdown process, a second-state breakdown process is performed to the MIS structure 10 by applying a second-polarity voltage $V_{g2}$ to the metal electrode layer 130 to induce a forward bias of the MIS structure 10, in which the second polarity is opposite to the first polarity. In some embodiments, the second-polarity voltage $V_{g2}$ may further cause the semiconductor layer 110 to be under an accumulation regime. In the embodiments where the MIS structure 10 is formed with the p-type silicon substrate 110, the second-polarity voltage $V_{g2}$ may be a negative voltage stress (NVS), such as a ramped NVS, a constant negative voltage level, or a negative current weep, or a constant negative current stress. In some alternative embodiments where the MIS structure 10 is formed with the n-type silicon substrate 110, the second-polarity voltage $V_{g2}$ may be a PVS, such as a ramped PVS, a constant positive voltage level, a positive current weep, or a constant positive current stress. Similar to the first-polarity voltage $V_{g1}$, under the second-polarity voltage $V_{g2}$, traps will generate within the oxide, thereby forming oxide traps/vacancies OV. Plural oxide traps/vacancies OV may form a local conductive percolation path, which is also referred to a BD path. The formation of the BD path by the second-polarity voltage $V_{g2}$ is considered and evidenced as non-self-protective. Stated differently, under the second-polarity voltage $V_{g2}$, BD would happen after the formation of a BD path, such that plural BD paths are formed progressively. With plural BD paths in the insulating layer 120, the MIS structure 10 of FIG. 2C can be referred to as a "State 2". Due to the self-protective mechanism of reversing bias of the MIS structure 10 (PVS for p-type semiconductor layer), only single BD event would happen. As a result, current after reversing bias would be much smaller compared with the current after forward bias (e.g., NVS for p-type semiconductor layer).

In some embodiments, the voltages $V_{g1}$ and $V_{g2}$ can be ramped PVS and NVS performed with current compliance. In some embodiments, the voltages $V_{g1}$ and $V_{g2}$ can be a constant voltage level set with a current-compliance condition. Setting current compliance could ensure the damage/breakdown to the insulator layer not to become too severe. The current compliance could be set up within about 100 nA to about 1 mA to control the severity of breakdown damage. In some other embodiments, the voltages $V_{g1}$ and $V_{g2}$ can be a constant current stress (CCS) set with voltage-compliance condition.

In some embodiments, the thickness of the insulating layer 120 may be in a range from about 1.5 nm to about 10 nm. If the thickness of the insulating layer 120 is greater than about 10 nm, multiple break down may occur easily and lead to State 2. If the thickness of the insulating layer 120 is less than about 1.5 nm, the insulating layer 120 may not break down easily. In some embodiments, the area of the metal electrode layer 130 (or the overlapping area among the metal electrode layer 130, the insulating layer 120, and the semiconductor layer 110) may be in a range from about 100 $nm^2$ to about 1 $mm^2$. If the area is greater than about 1 $mm^2$, the device size may be enlarged unnecessarily. If the area is less than about 100 $nm^2$, the breakdown area may occupy the entire area, and no window for dielectric material.

Figure 3A:
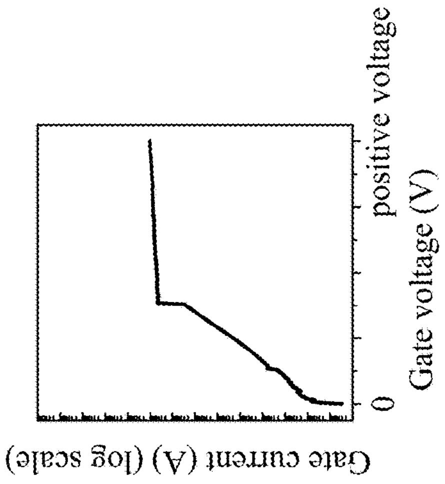
FIG. 3A is a current measurement result of a MIS structure under ramped positive voltage stress (PVS) in accordance with some embodiments of the present disclosure.
Figure 3B:
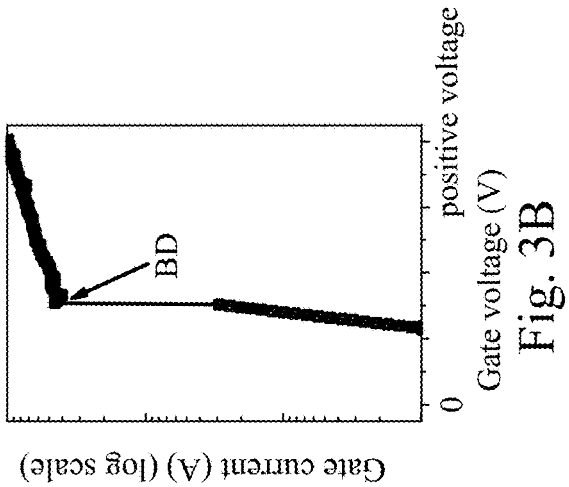
FIG. 3B is an enlarged view of a portion of FIG. 3A.

FIG. 3A is a current measurement result of a MIS structure under ramped positive voltage stress (PVS) in accordance with some embodiments of the present disclosure. FIG. 3B is an enlarged view of a portion of FIG. 3A. In FIGS. 3A and 3B, the horizontal axis is the gate voltage ($V_G$), and the vertical axis is the gate current. As shown in FIGS. 3A and 3B, when the voltage increases, only one BD event happens. It is evidence that the formation of the BD path by the ramped PVS is self-protective.

Figure 4A:
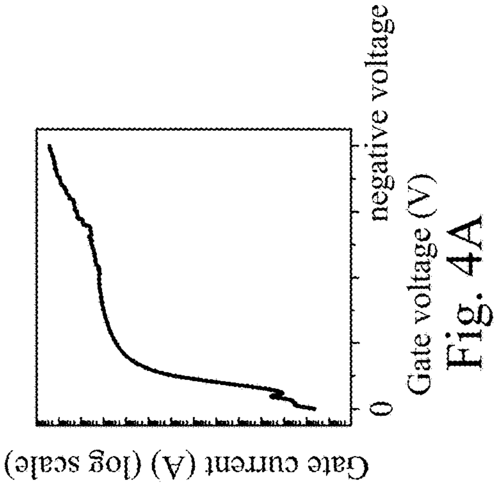
FIG. 4A is a current measurement result a MIS structure under ramped negative voltage stress (NVS) in accordance with some embodiments of the present disclosure.
Figure 4B:
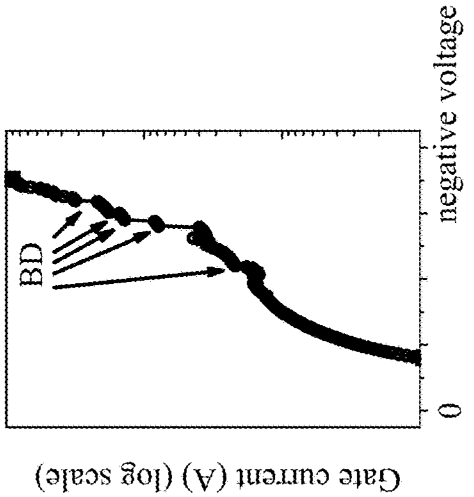
FIG. 4B is an enlarged view of a portion of FIG. 4A.

FIG. 4A is a current measurement result of a MIS structure under ramped negative voltage stress (NVS) in accordance with some embodiments of the present disclosure. FIG. 4B is an enlarged view of a portion of FIG. 4A. In FIGS. 4A and 4B, the horizontal axis is the gate voltage ($V_G$), and the vertical axis is the gate current. As shown in FIGS. 4A and 4B, when the voltage increases, several BD events happen. It is evidence that the formation of the BD path by the ramped NVS is non-self-protective.

Figure 5:
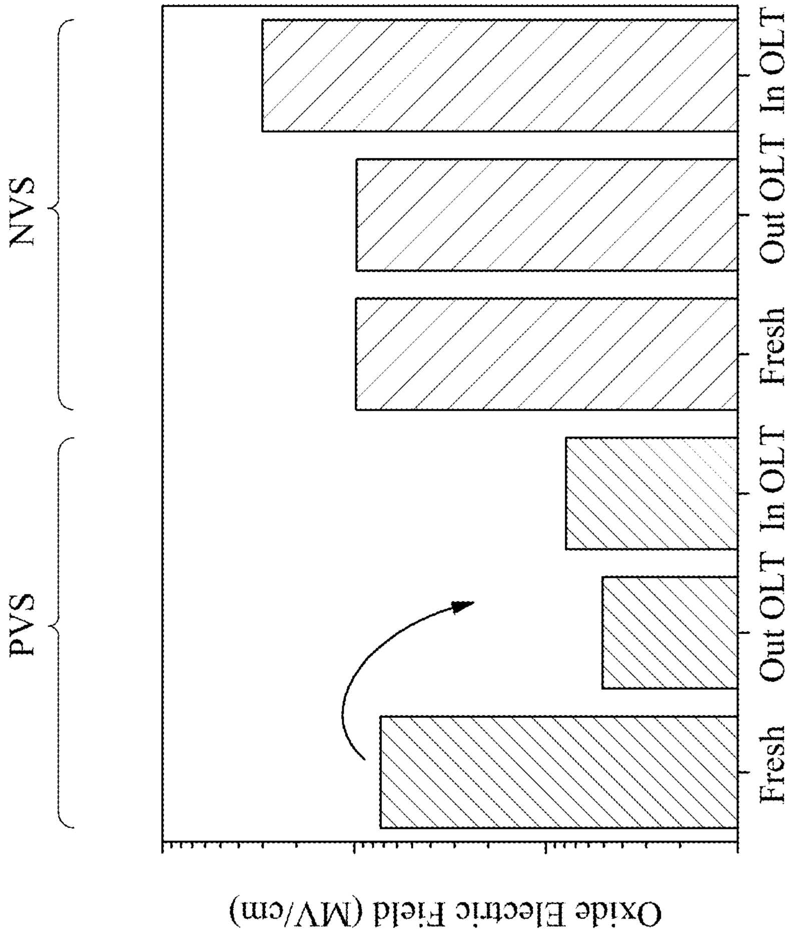
FIG. 5 is a Technology Computer Aided Design (TCAD) simulation result of oxide electric field under PVS and NVS in accordance with some embodiments of the present disclosure.

FIG. 5 is a Technology Computer Aided Design (TCAD) simulation result of oxide electric field under PVS and NVS in accordance with some embodiments of the present disclosure. When one BD happens, originally insulating oxide becomes locally conductive, and could be considered as oxide locally thinning (OLT). In FIG. 5, "Fresh" indicates the oxide electric field in the MIS structure 10 having no BD. "Out OLT" indicates the oxide electric field in a non-thinning portion (or a no-BD portion) of the MIS structure 10 having BD. And, "In OLT" indicates the oxide electric field in a thinning portion (or a BD portion) of the MIS structure 10 having BD.

As shown in FIG. 5, comparing "Fresh" with "Out OLT" and "In OLT" under PVS, once a BD OLT spot has been formed, electron density in silicon drops, and oxide electric field subsequently decreases significantly. Also, comparing "Fresh" with "Out OLT" and "In OLT" under NVS, once BD OLT spots have been formed, electron density in silicon drops, and oxide electric field subsequently decreases. The amount that the oxide electric field decreases from to "Fresh" with "Out OLT" or "In OLT" under PVS is much greater than the amount the oxide electric field decreases from to "Fresh" with "Out OLT" or "In OLT" under NVS. Thus, the BD under PVS could be considered as more self-protective than the BD under NVS. In some embodiments, BD under PVS could be considered as self-protective, and BD under PVS could be considered as non-self-protective.

Figure 6A:
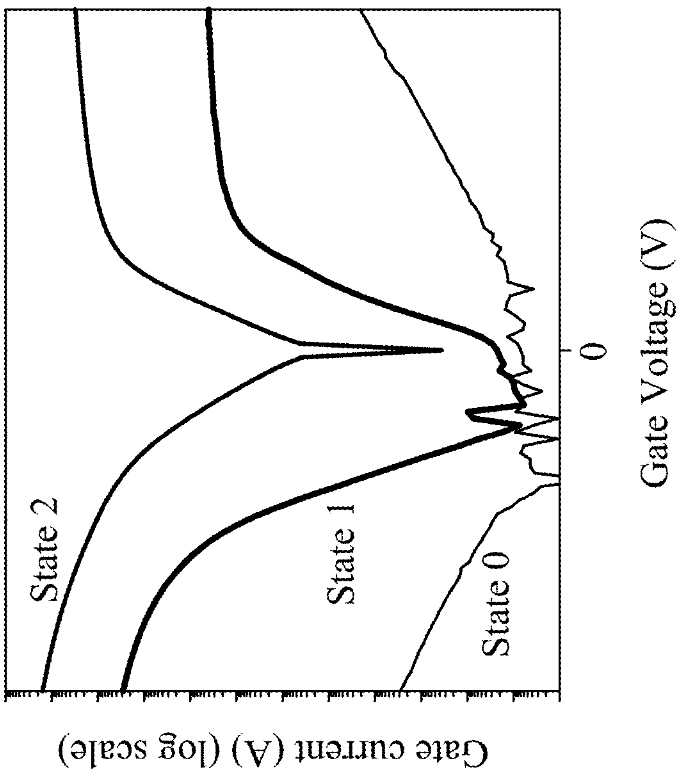
FIG. 6A is diagram illustrating I-V characteristics of a programmed MIS structure in log scale in accordance with some embodiments of the present disclosure.
Figure 6B:
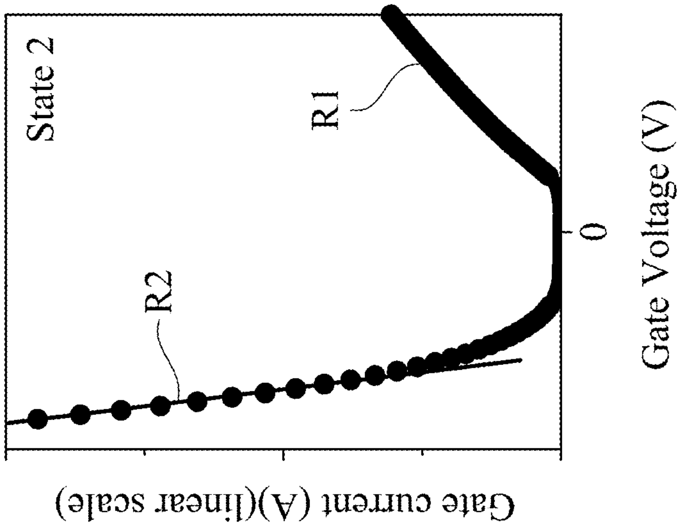
FIG. 6B is an enlarged diagram of the I-V characteristic of the programmed MIS structure after PVS and NVS at State 2 in linear scale in accordance with some embodiments of the present disclosure.

FIG. 6A is diagram illustrating I-V characteristics of a programmed MIS structure in log scale in accordance with some embodiments of the present disclosure. FIG. 6B is an enlarged diagram of the I-V characteristic of the programmed MIS structure after PVS and NVS at State 2 in linear scale in accordance with some embodiments of the present disclosure. The curves of I-V characteristics are denoted with "State 0", "State 1", and "State 2" corresponding to the three states of MIS structure 10 in FIGS. 2A-2C. As evidenced from FIG. 6B, for State 2, the device becomes resistance-like, for example, the I-V characteristic of MIS structure at State 2 has a I-V characteristic with a first slope R1 and a second slope R2, which indicate linear relationships between voltage and current, and linear resistances. Stated differently, the MIS structure at State 2 has a first linear resistance in a positive voltage range and a second linear resistance in a negative voltage range. In some embodiments, as illustrated in FIG. 6B, an absolute value of a slope R2 of the second linear resistance is greater than an absolute value of a slope R1 of the first linear resistance.

The applied reading voltage should be able to recognize the three states, for example, an arbitrary non-zero voltage. In some embodiments, the reading voltage may be in a range from about −0.5V to about −1V or a range from about 0.5V to about 1V to have better read out. If the absolute value of the reading voltage is less than about 0.5V, the read disturbance may become too large. If the absolute value of the reading voltage is greater than about 1V, the power consumption may be too large.

Figure 7:
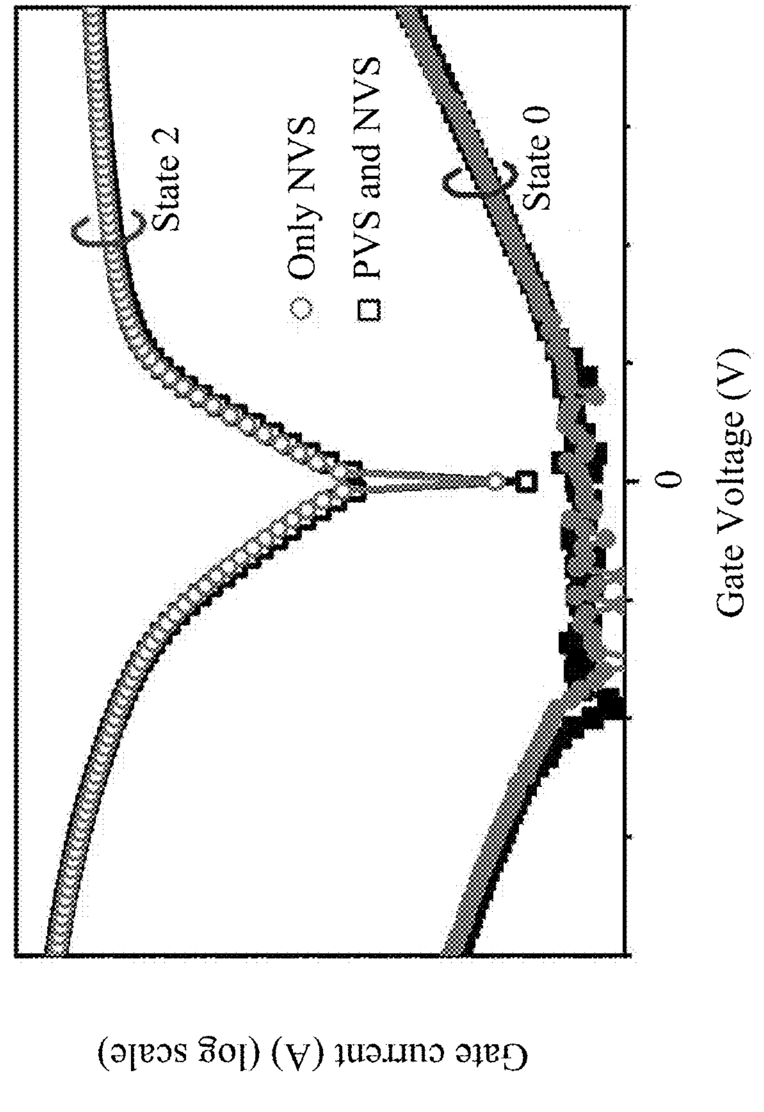
FIG. 7 is diagram illustrating I-V characteristics of two programmed MIS structures in log scale in accordance with some embodiments of the present disclosure.

FIG. 7 is diagram illustrating I-V characteristics of two programmed MIS structures in log scale in accordance with some embodiments of the present disclosure. One MIS structure is programmed to State 2 by only NVS, and another MIS structure is programmed to State 2 by PVS and NVS. It is evidenced from FIG. 7 that the operation of directly applying NVS without PVS would achieve the same result as the operation of applying PVS then subsequently NVS. Thus, PVS is not necessary for the device to be programmed to State 2.

Figure 8A:
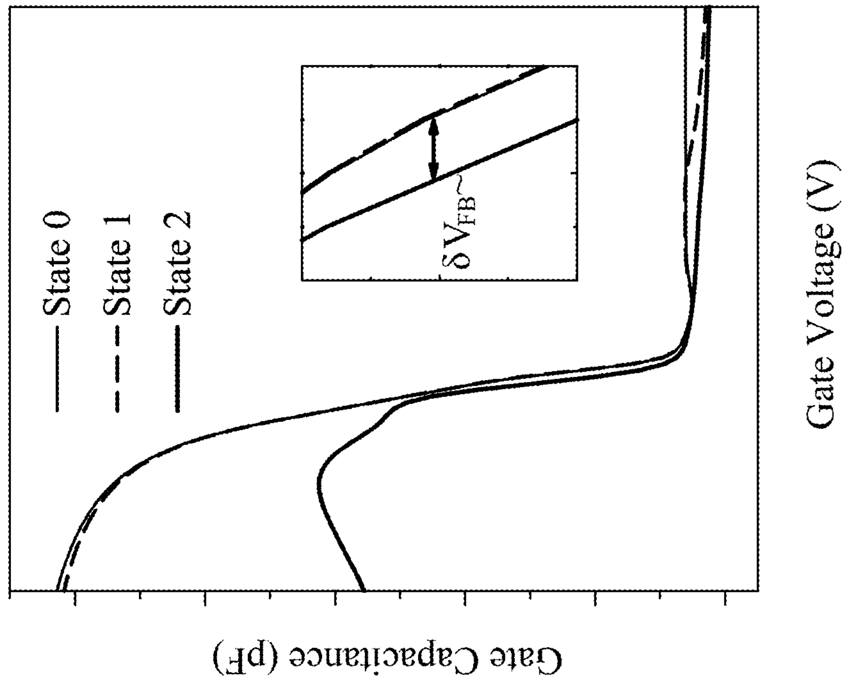
FIG. 8A is diagram illustrating C-V characteristic of MIS structure in accordance with some embodiments of the present disclosure.
Figure 8B:
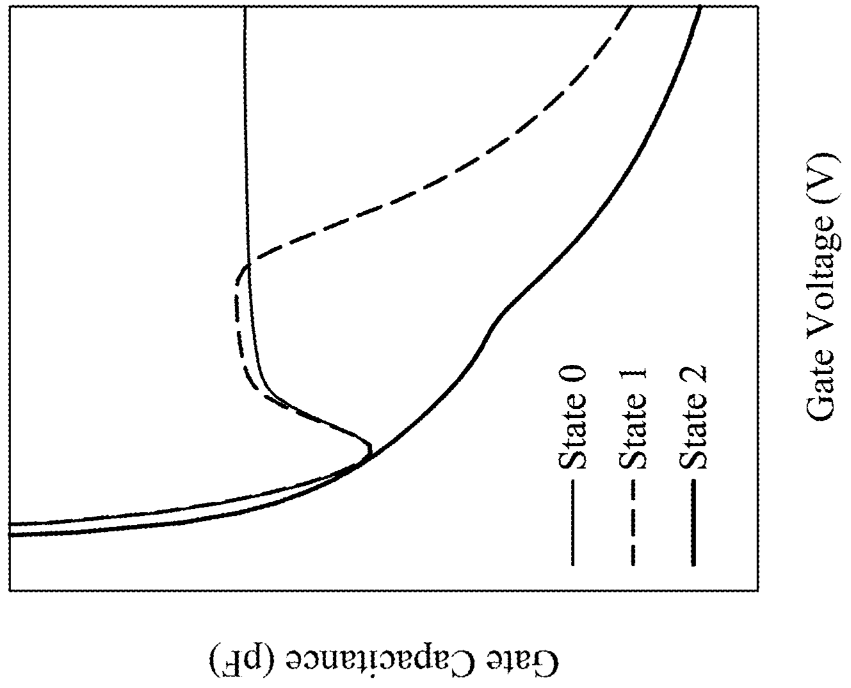
FIG. 8B is an enlarged diagram of the C-V characteristic of MIS structure of FIG. 8A in accordance with some embodiments of the present disclosure.

FIG. 8A is diagram illustrating C-V characteristic of MIS structure in accordance with some embodiments of the present disclosure. FIG. 8B is an enlarged diagram of the C-V characteristic of MIS structure of FIG. 8A in accordance with some embodiments of the present disclosure. Deep depletion happens earlier for the MIS structure programmed to State 2. Between State 0 and State 2 (or State 0 and State 1), a negative flat band voltage shift ($\delta V_{FB}$) is observed, the negative flat band voltage shift ($\delta V_{FB}$) indicates positive charged oxygen traps/vacancies are introduced inside the dielectric layer. For example, $\delta V_{FB}$ for State 2 may be in a range from about 0.01V to about 5 V, and $\delta V_{FB}$ for State 1 may be less than 0.01V. This indicates that more positive charged oxygen traps/vacancies are introduced inside the dielectric layer for State 2 than for State 1.

Figure 9A:
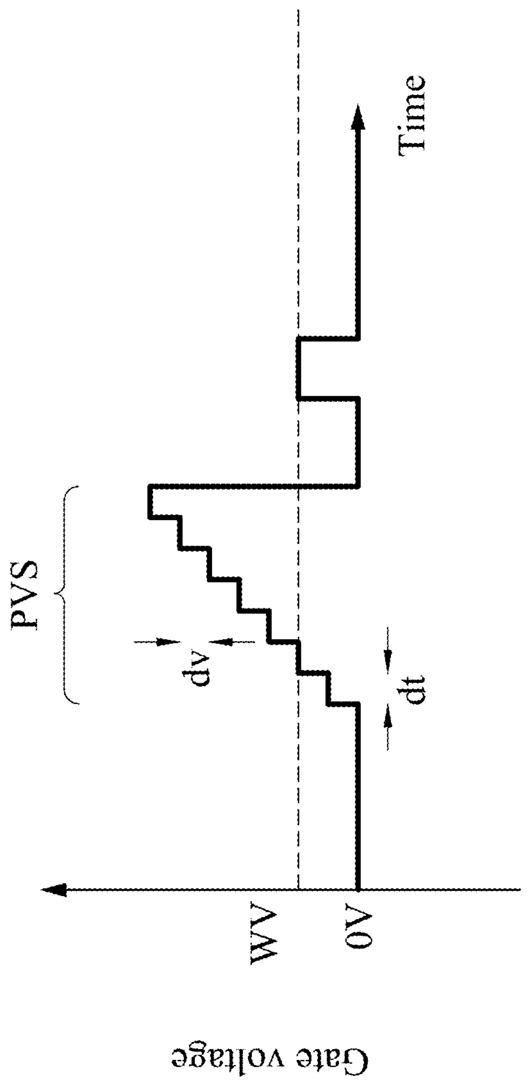
FIGS. 9A-9C are programming and reading operations of MIS structures in accordance with some embodiments of the present disclosure.
Figure 9B:
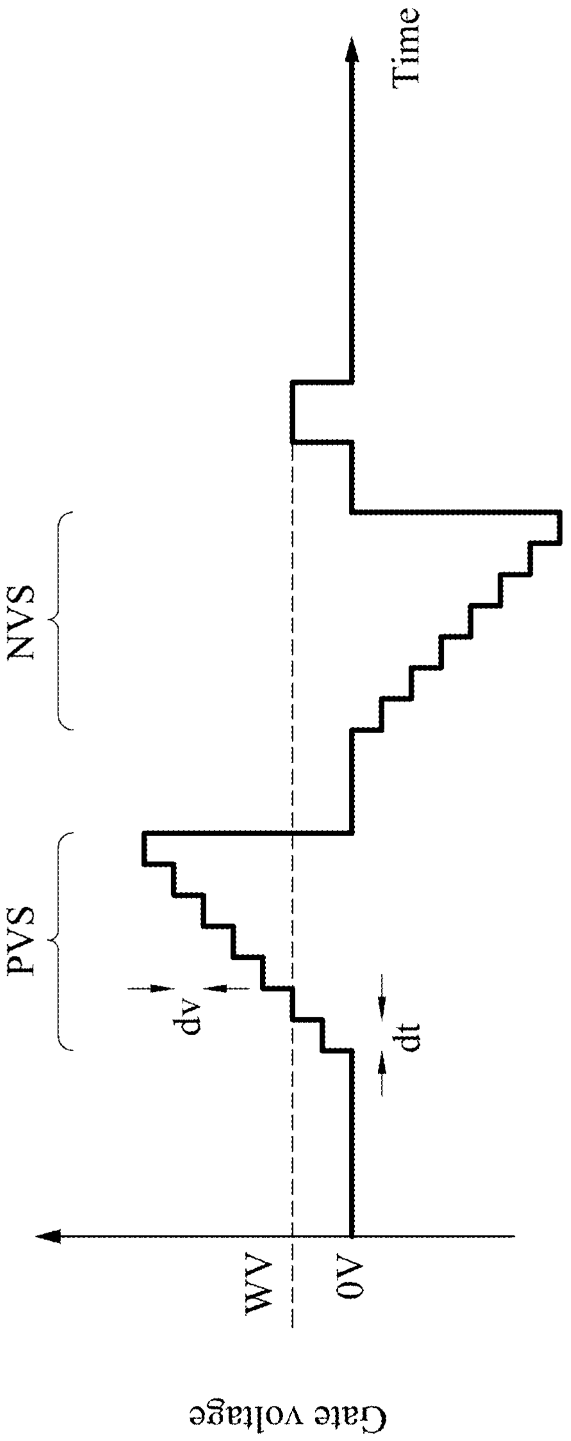
Figure 9C:
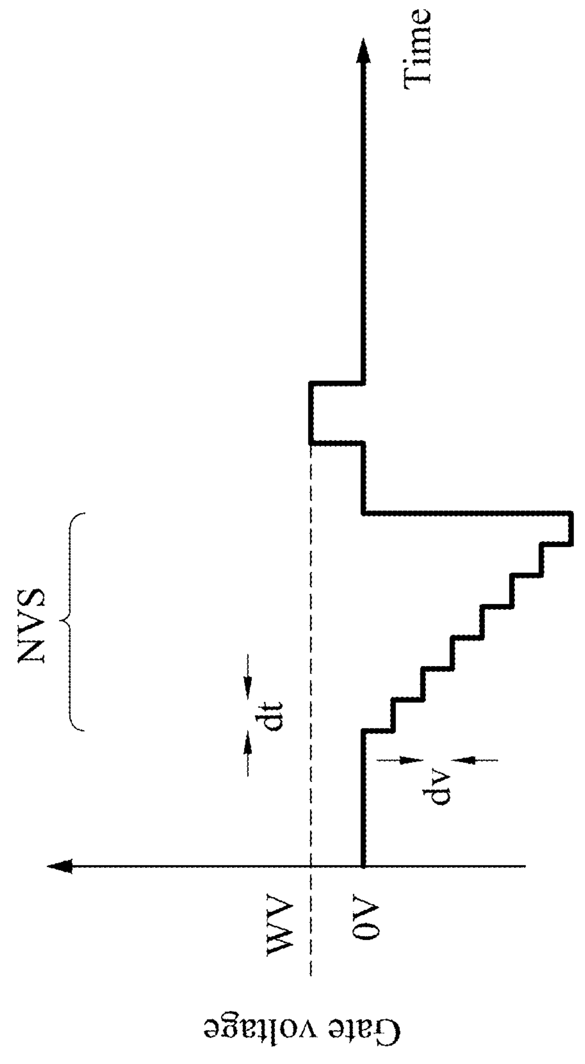

FIGS. 9A-9C are programming and reading operations of MIS structures in accordance with some embodiments of the present disclosure. In the present embodiments, the ramped PVS and NVS are used for programming operation. The ramped PVS may be in a range from about 0 V to about 8V, the rampled NVS may be in a range from about 0V to about −8V. The ramped PVS and NVS may have a voltage step ranging from about 0.05 mV to about 1V, and a time step ranging from about 0.01 second to about 1 second. If the voltage step is less than 0.05 mV or the time step is less than about 0.01 second, it may be difficult to form the breakdown the dielectric layer. If the voltage step is greater than about 1V or the time step is greater than about 1 second, power consumption may increase unnecessarily. In some embodiments, a positive reading voltage applied after the programing operation may have an absolute value greater than that of the voltage step of the ramped PVS and NVS, and a suitable read time. For example, the positive reading voltage may be in a range from about 0.5V to about 1V and a read time in a range from about 50 milliseconds to about 10 seconds.

In FIG. 9A, the MIS structure is programed from State 0 to State 1 by a ramped PVS. The ramped PVS causes the aforementioned first-state breakdown process. The positive reading voltage may be applied to read the MIS structure at State 1.

In FIG. 9B, the MIS structure is programed from State 0 to State 1 by a ramped PVS, and then programed from State 1 to State 2 by a ramped NVS. The ramped PVS and the ramped NVS cause the aforementioned second-state breakdown process. The positive reading voltage WV may be applied to read the MIS structure at State 2.

In FIG. 9C, the MIS structure is programed from State 0 to State 2 by a ramped NVS. The ramped NVS causes the aforementioned second-state breakdown process. The positive reading voltage WV may be applied to read the MIS structure at State 2.

Figure 9D:
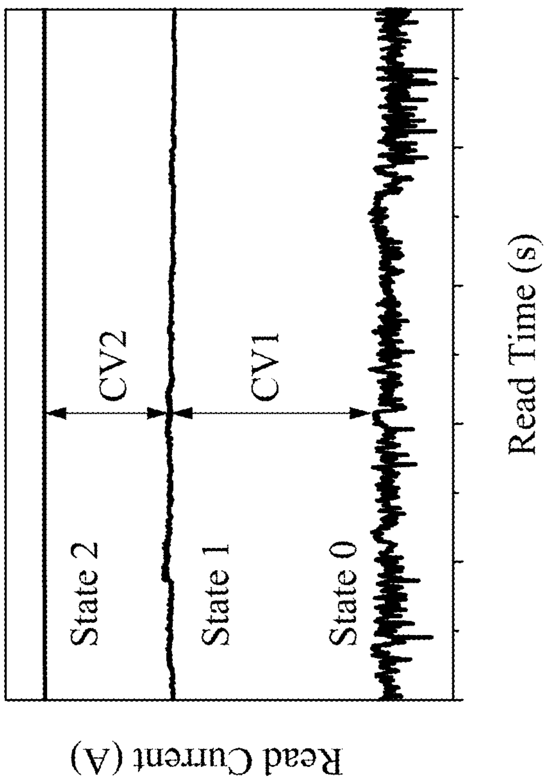
FIG. 9D is a diagram illustrating non-volatile properties of a programmed MIS structure under a positive reading voltage in accordance with some embodiments of the present disclosure.

FIG. 9D is a diagram illustrating non-volatile properties of a programmed MIS structure under a positive reading voltage WV in accordance with some embodiments of the present disclosure. The horizontal axis is reading time, and the vertical axis is reading current. Different current values would be read out for antifuse in different states under continuous reading. Little disturbance happens, and all three states are stable under continuous reading for over 1000 seconds. Under the positive reading voltage WV, for a single device, a current difference CV1 between State 0 and State 1 is about $10^4$ times to about $10^6$ times (e.g., about $10^5$ times), a current difference CV2 between State 1 and State 2 is about $10^2$ times to about $10^4$ times (e.g., about $10^3$ times).

Figure 9E:
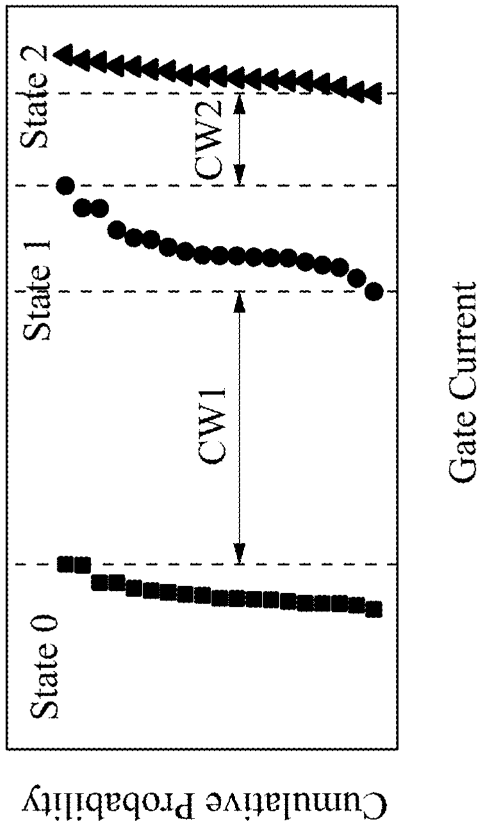
FIG. 9E is diagram illustrating probability for MIS structure programed at the three current states under a positive reading voltage in accordance with some embodiments of the present disclosure.

FIG. 9E is diagram illustrating probability for MIS structure programed at the three current states in accordance with some embodiments of the present disclosure. The horizontal axis is reading current, and the vertical axis is probability. Statistics show relatively tight distribution for the three current states. Under the positive reading voltage WV, for plural device, a current window CW1 between State 0 and State 1 is about $10^4$ times to about $10^6$ times (e.g., about $10^5$ times), a current difference CW2 between State 1 and State 2 is about $10^1$ times to about $10^3$ times (e.g., about $10^2$ times). In some embodiments, the minimum current window margin could be as large as 100 times.

Figure 10A:
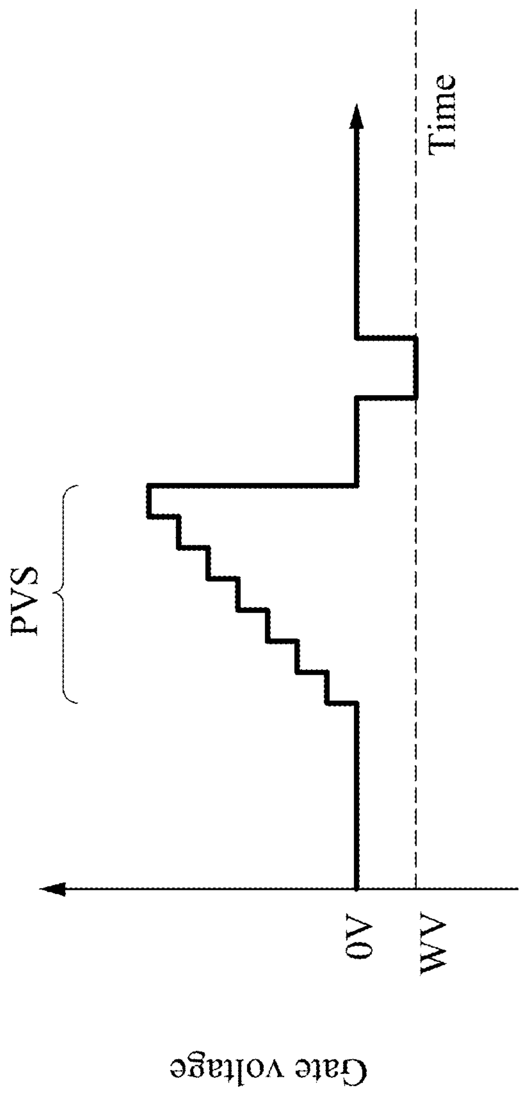
FIGS. 10A-10C are programming and reading operations of MIS structures in accordance with some embodiments of the present disclosure.
Figure 10B:
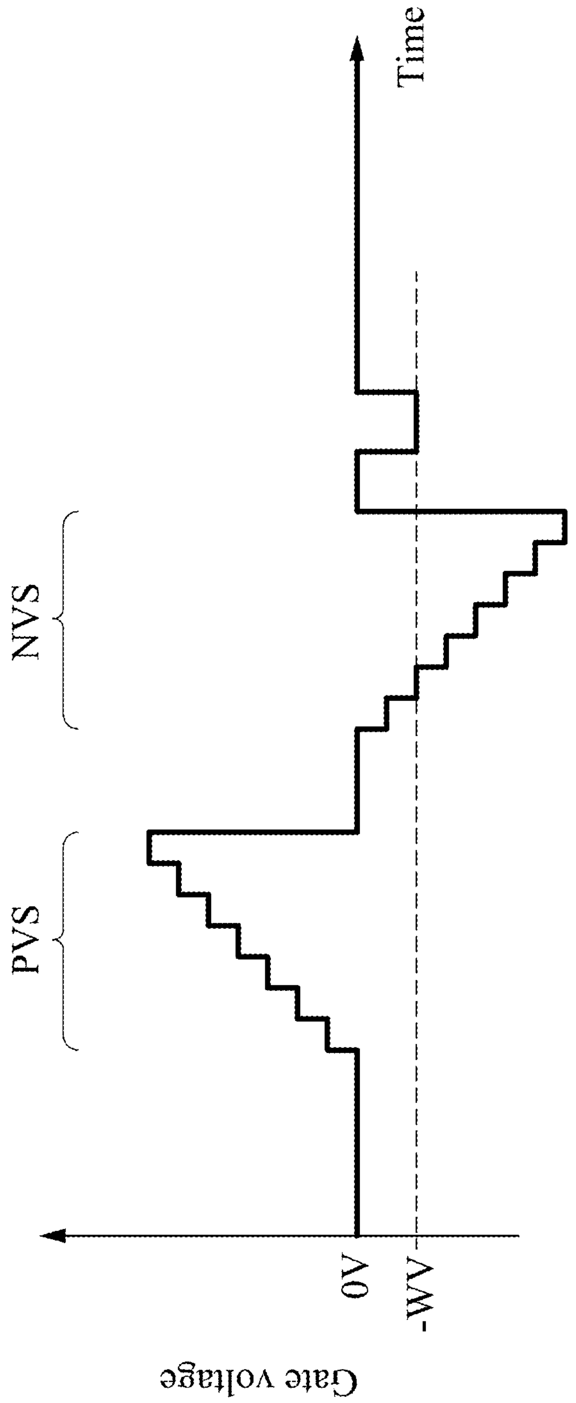
Figure 10C:
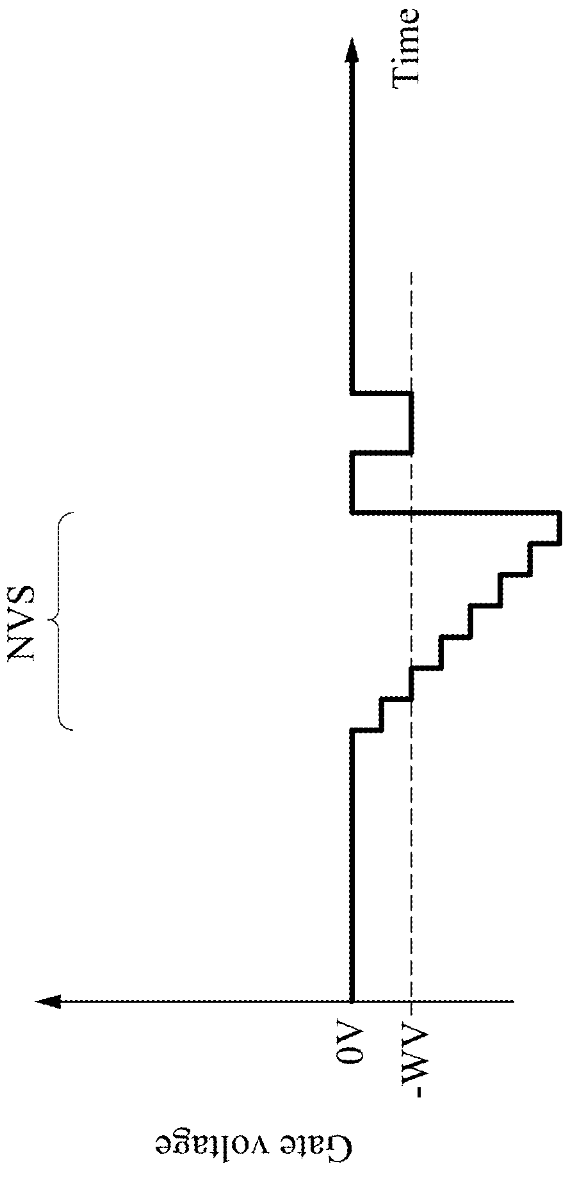

FIGS. 10A-10C are programming and reading operations of MIS structures in accordance with some embodiments of the present disclosure. In some embodiments, the ramped PVS and NVS are used for programming operation, and the ramped PVS and NVS may have a voltage step ranging from about 0.05 mV to about 1V, and a time step ranging from about 0.01 second to about 1 second. In some embodiments, a negative reading voltage WV applied after the programing operation may have an absolute value greater than that of the voltage step of the ramped PVS and NVS and a suitable read time. For example, the negative reading voltage WV may be in a range from about −0.5V to about −1V and a read time in a range from about 50 milliseconds to about 10 seconds.

In FIG. 10A, the MIS structure is programed from State 0 to State 1 by a ramped PVS. The ramped PVS causes the aforementioned first-state breakdown process. A negative reading voltage WV may be applied to read the MIS structure at State 1.

In FIG. 10B, the MIS structure is programed from State 0 to State 1 by a ramped PVS, and then programed from State 1 to State 2 by a ramped NVS. The ramped PVS and the ramped NVS cause the aforementioned second-state breakdown process. A negative reading voltage may be applied to read the MIS structure at State 2.

In FIG. 10C, the MIS structure is programed from State 0 to State 2 by a ramped NVS. The ramped NVS causes the aforementioned second-state breakdown process. A negative reading voltage WV may be applied to read the MIS structure at State 2.

Figure 10E:
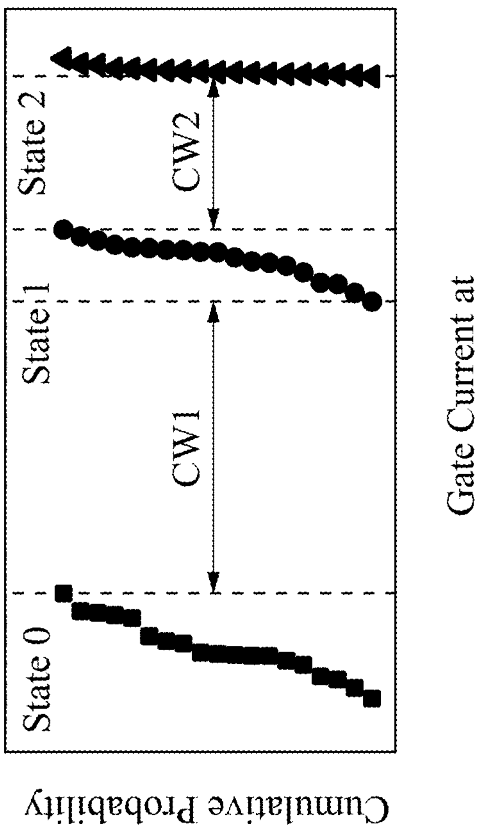
FIG. 10E is diagram illustrating probability for MIS structure programed at the three current states under a negative reading voltage in accordance with some embodiments of the present disclosure.
Figure 10D:
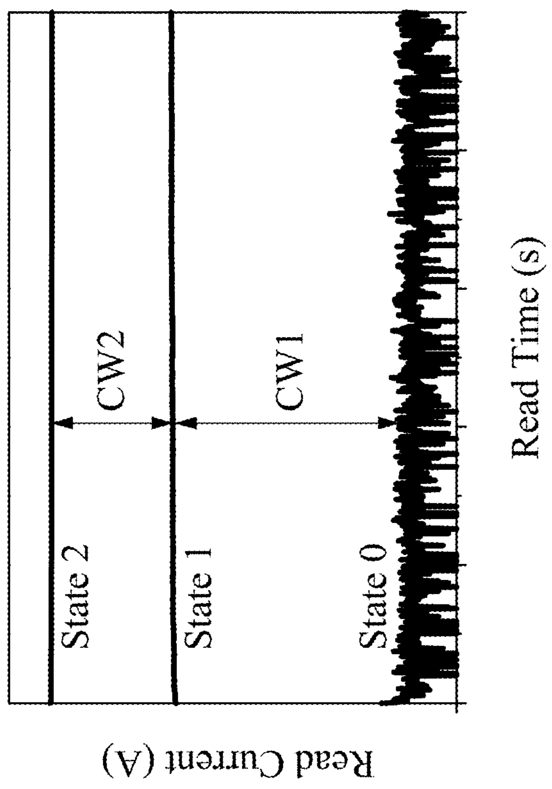
FIG. 10D is a diagram illustrating non-volatile properties of a programmed MIS structure under a negative reading voltage in accordance with some embodiments of the present disclosure.

FIG. 10D is a diagram illustrating non-volatile properties of a programmed MIS structure under a negative reading voltage in accordance with some embodiments of the present disclosure. The horizontal axis is reading time, and the vertical axis is reading current. Different current values would be read out for antifuse in different states under continuous reading. Little disturbance happens, and all three states are stable under continuous reading for over 1000 seconds. Under the negative reading voltage, for a single device, a current difference CV1 between State 0 and State 1 is about $10^4$ times to about $10^6$ times (e.g., $10^5$ times), and a current difference CV2 between State 1 and State 2 is about $10^2$ times to about $10^4$ times (e.g., $10^3$ times).

FIG. 10E is diagram illustrating probability for MIS structure programed at the three current states under a negative reading voltage in accordance with some embodiments of the present disclosure. Statistics show relatively tight distribution for the three current states. The horizontal axis is reading current, and the vertical axis is probability. Under the negative reading voltage, for plural device, a current window CW1 between State 0 and State 1 is about $10^4$ times to about $10^6$ times (e.g., about $10^5$ times), a current difference CW2 between State 1 and State 2 is about $10^2$ times to about $10^4$ times (e.g., about $10^3$ times). The minimum current window margin could be as large as 100 times.

Figure 11:
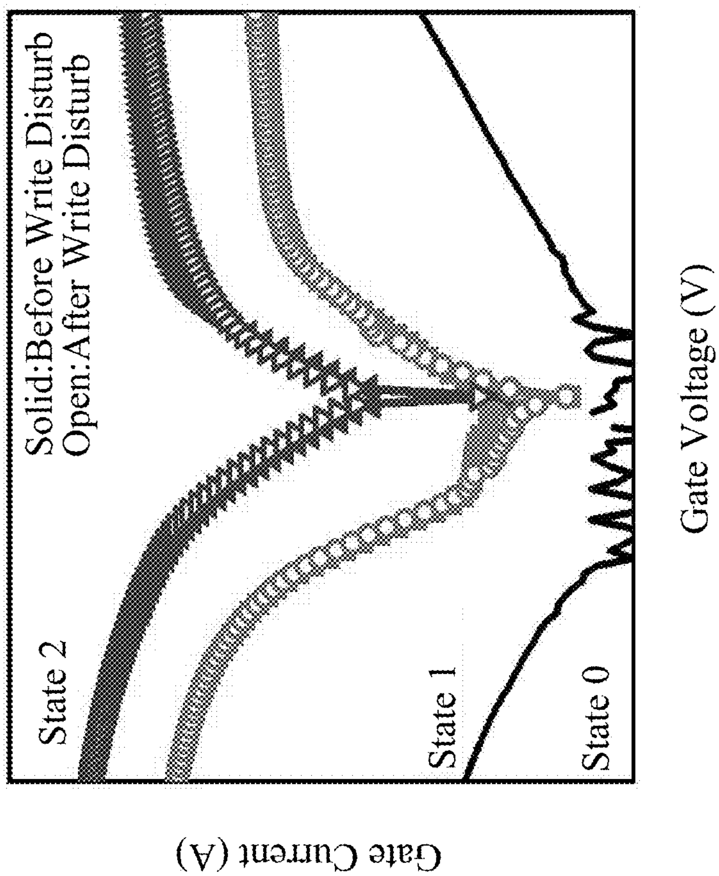
FIG. 11 is a diagram illustrating I-V characteristics of MIS structure in log scale under write disturbance in accordance with some embodiments of the present disclosure.

FIG. 11 is a diagram illustrating I-V characteristics of MIS structure in log scale under write disturbance in accordance with some embodiments of the present disclosure. For State 1, after PVS forming, a positive write disturb is applied to the metal electrode layer. For State 2, after NVS forming, a negative write disturb is applying to the metal electrode layer. No significant current level changes after write disturbs for both states.

Figure 12:
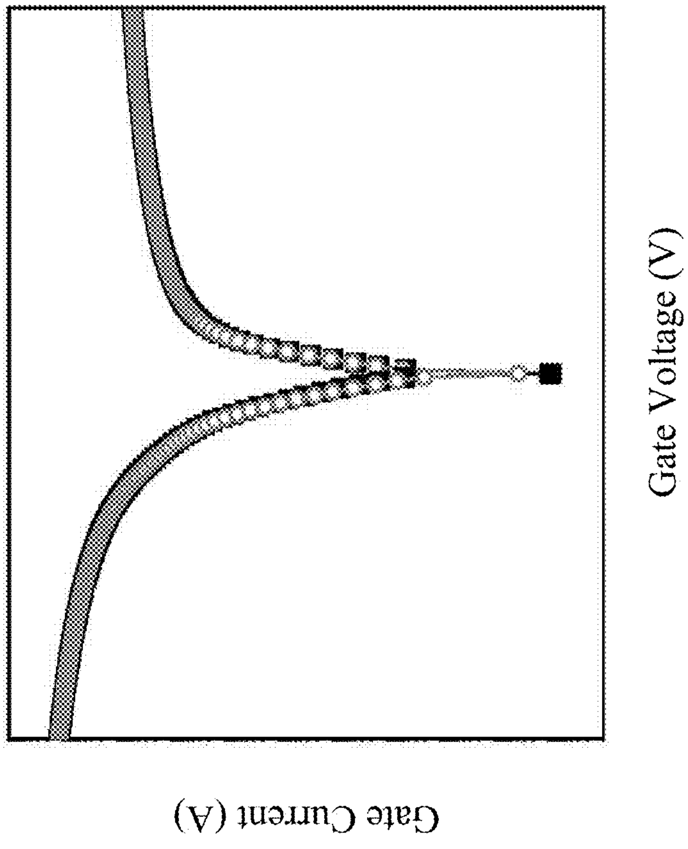
FIG. 12 is a diagram illustrating I-V hysteresis for a programmed MIS structure at State 2 when sweeping voltage forward and backward.

FIG. 12 is a diagram illustrating I-V hysteresis for r a programmed MIS structure at State 2 when sweeping voltage forward and backward. The square dots indicate sweeping voltage forward, and the circle dots indicate sweeping voltage backward. As the MIS structure (or antifuse) programmed at State 2 shows almost no hysteresis.

Figure 13:
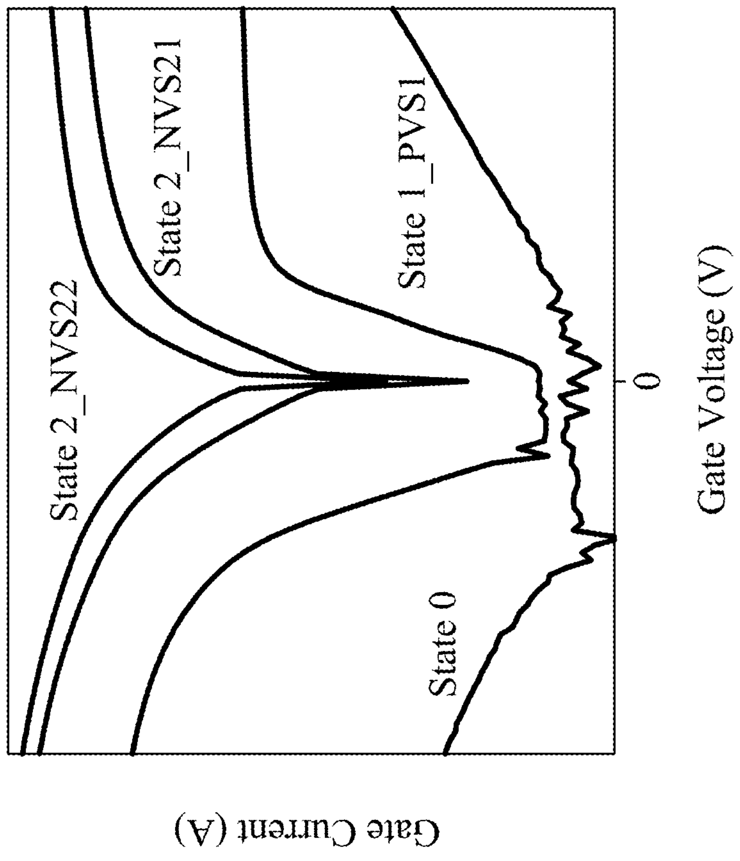
FIG. 13 is a diagram illustrating I-V characteristics of MIS structure in accordance with some embodiments of the present disclosure.

FIG. 13 is a diagram illustrating I-V characteristics of MIS structure in accordance with some embodiments of the present disclosure. The curves of I-V characteristics are denoted with "State 0", "State 1_PVS1", "State 2_PVS21", and "State 2_PVS22". As aforementioned, "State 0" indicates that the MIS structure 10 is not yet programmed. "State 1_PVS1" indicates the MIS structure 10 is programed by a first-state breakdown process to have a BD path. "State 2_NVS21" and "State 2_NVS22" indicates the MIS structure 10 is programed by two different second-state breakdown processes to have plural BD paths.

In the first-state breakdown process for programming the MIS structure 10 indicated by "State 1_PVS1", the first-polarity voltage stress is a large enough constant voltage stress applied on the gate electrode for enough time until a single BD event happens and the dielectric would breakdown. For example, the first-polarity voltage stress is a constant positive voltage for a suitable time period for a p-type MIS structure 10. The constant positive voltage could be set with an absolute value ranging from about 1 V to about 10 V depending on the oxide material and thickness. And, the suitable time period may be in a range from about 5 seconds to about 1 minute depending on the oxide material and thickness.

In the second-state breakdown process for programming the MIS structure 10 indicated by "State 2_NVS21", the second-polarity voltage stress may be a large constant current stress (CCS) applied for a constant time with a voltage compliance. For example, when the MIS Structure 10 has a p-type semiconductor layer, the constant current is in a range from about −80 mA to about −120 mA, the constant time is in a range from about 8 seconds to about 12 seconds, and the voltage compliance may be in a range from about −5V to about −11V. Using CCS with voltage-compliance condition for forming State 2, the current runaway during breakdown process will not be too severe. The constant current could be set within 10 nA to about 1 A for control the severity of breakdown damage. By adjusting the compliance, the post-BD current level could be modulated.

The second-state breakdown process for programming the MIS structure 10 indicated by "State 2_NVS22" may be similar to the second-state breakdown process for programming the MIS structure 10 indicated by "State 2_NVS21, except that the voltage compliance for the MIS structure 10 indicated by "State 2_NVS22" has an absolute value greater than that of the "State 2_NVS21". For example, the voltage compliance for the MIS structure 10 indicated by "State 2_NVS22" is in a range from about-12V to about −17V, while the voltage compliance for the MIS structure 10 indicated by "State 2_NVS21" is in a range from about-6V to about-8V.

In some alternative embodiments, the second-state breakdown process for programming the MIS structure 10 indicated by "State 2_NVS21" and/or "State 2_NVS22", the second-polarity voltage stress is a large enough constant voltage stress applied on the gate electrode for enough time until several BD event happens. For example, the second-polarity voltage stress is a constant negative voltage for a suitable time period for a p-type MIS structure 10. The constant negative voltage could be set with an absolute value ranging from about −1 V to about −10 V depending on the oxide material and thickness. And, the suitable time period may be in a range from about 5 seconds to about 1 minute depending on the oxide material and thickness.

Figure 14:
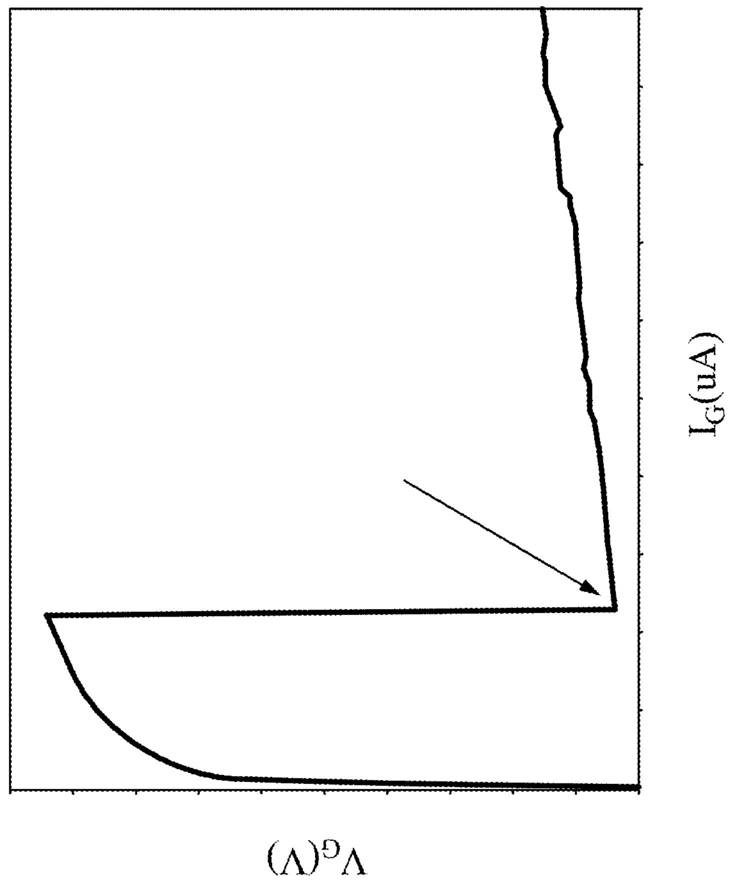
FIG. 14 is a voltage measurement result of a MIS structure under sweep current in accordance with some embodiments of the present disclosure.

FIG. 14 is a voltage measurement result of a MIS structure under sweep current in accordance with some embodiments of the present disclosure. In the present embodiments, sweeping current is used for programming operation. The current sweeps from 0 to a large current level. When BD happens, the measured gate voltage will drop immediately. For the first-state breakdown process to induce a reverse bias of the MIS structure 10, current sweeps from about 0 uA to about 10 uA. For the second-state breakdown process to induce a forward bias of the MIS structure 10, current sweeps from about 0 to about-100 mA. In FIG. 14, when current sweeps from about 0 uA to about 10 uA, a measured voltage drop could be observed. As indicated by the arrow, a BD spot/OLT region has appeared.

Figure 15A:
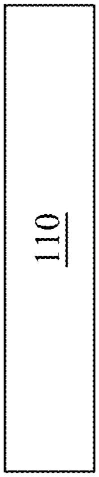
FIGS. 15A-15C illustrate various stages of fabricating a MIS structure in accordance with some embodiments of the present disclosure.
Figure 15B:
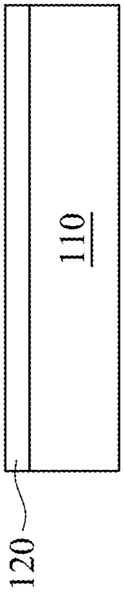
Figure 15C:
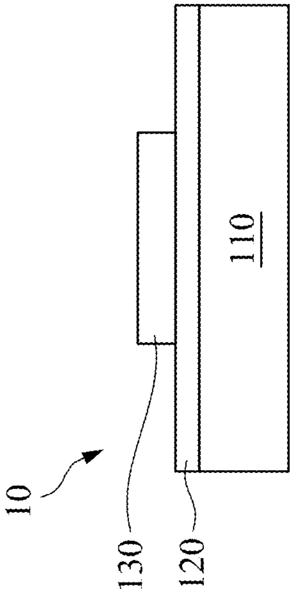

FIGS. 15A-15C illustrate various stages of fabricating a MIS structure 10 in accordance with some embodiments of the present disclosure. In FIG. 15A, a semiconductor layer 100 is provided. In some embodiments, the semiconductor layer 110 may be made of Si, Ge, GaAs, $MoS_2$, or other suitable semiconductor material. In the embodiments of FIGS. 15A-15C, the semiconductor layer 110 can be a p-type semiconductor layer, for example, doped with boron (B), gallium (Ga), indium (In), aluminium (Al), or the like, or a n-type semiconductor layer, for example, doped with phosphorus (P), arsenic (As), or antimony (Sb), or the like.

In FIG. 15B, an insulating layer 120 is deposited over the semiconductor layer 110. The insulating layer 120 may be made of dielectric material, such as silicon oxide ($SiO_2$), aluminum oxide ($Al_2O_3$), hafnium oxide ($HfO_2$), hBN, or other suitable dielectric material. In some embodiments, the insulating layer 120 can be deposited using suitable process, such as chemical vapor deposition (CVD), physical vapor deposition (PVD), atomic layer deposition (ALD), or the like.

In FIG. 15C, a metal electrode layer 130 is formed over the insulating layer 120. In some embodiments, the metal electrode layer 130 may be made of metal, such as aluminum (Al), titanium nitride (TiN), gold (Au), tungsten (W), or other suitable metal. The metal electrode layer 130 may be formed by, for example, depositing a metal layer over the insulating layer 120, and then patterning the metal layer according to a predetermined pattern. As a result, a MIS structure 10 is formed.

Figure 16B:
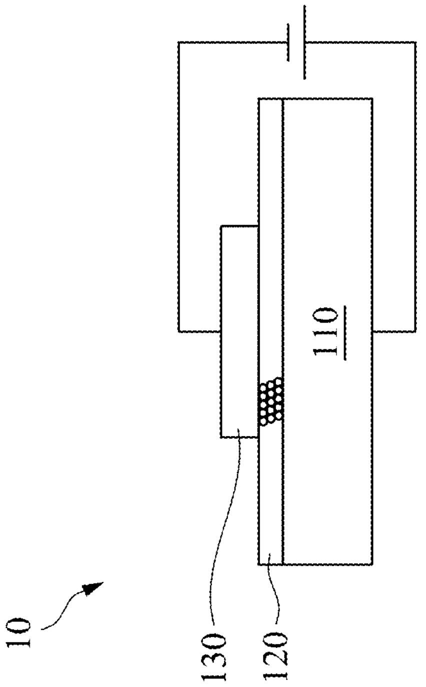
FIGS. 16A and 16B illustrate programing operations performed on the MIS structure having a p-type semiconductor layer in accordance with some embodiments of the present disclosure.
Figure 16A:
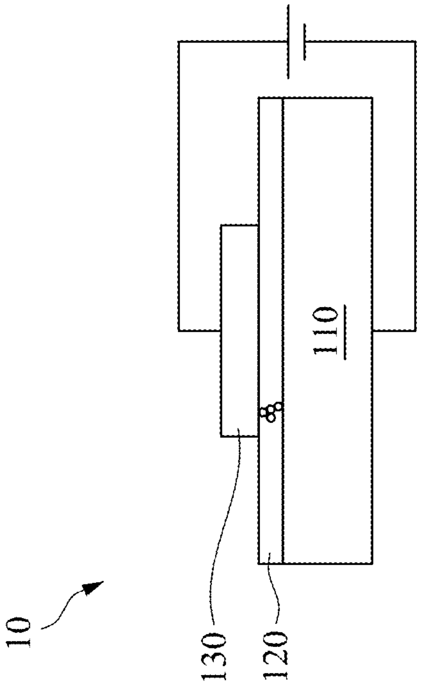

FIGS. 16A and 16B illustrate programing operations performed on the MIS structure 10 having a p-type semiconductor layer 110 in accordance with some embodiments of the present disclosure. In FIG. 16A where the semiconductor layer 110 is a p-type semiconductor layer, a first-state breakdown process is performed to the MIS structure 10 by applying a positive voltage stress to the metal electrode layer 130 to induce a reverse bias of the MIS structure 10. As shown in FIG. 16A, a BD path is formed. In FIG. 16B where the semiconductor layer 110 is a p-type semiconductor layer, a second-state breakdown process is performed to the MIS structure 10 by applying a negative voltage stress to the metal electrode layer 130 to induce a forward bias of the MIS structure 10. As shown in FIG. 16B, plural BD paths are formed.

Figure 17A:
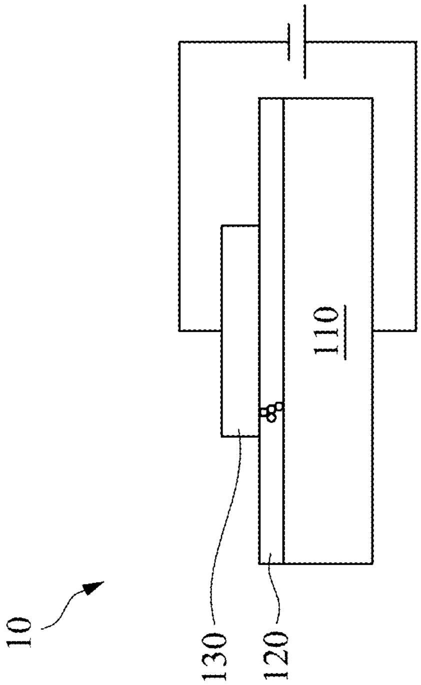
FIGS. 17A and 17B illustrate programing operations performed on the MIS structure having a n-type semiconductor layer in accordance with some embodiments of the present disclosure.
Figure 17B:
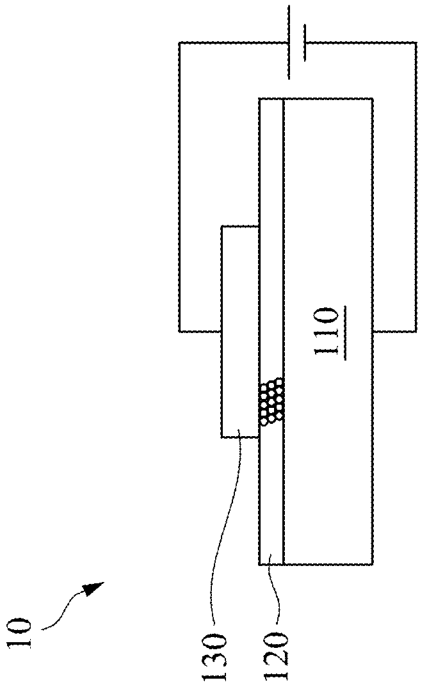

FIGS. 17A and 17B illustrate programing operations performed on the MIS structure 10 having a n-type semiconductor layer 110 in accordance with some embodiments of the present disclosure. In FIG. 17A where the semiconductor layer 110 is a n-type semiconductor layer, a first-state breakdown process is performed to the MIS structure 10 by applying a negative voltage stress to the metal electrode layer 130 to induce a reverse bias of the MIS structure 10. As shown in FIG. 17A, a BD path is formed. In FIG. 17B where the semiconductor layer 110 is a n-type semiconductor layer, a second-state breakdown process is performed to the MIS structure 10 by applying a positive voltage stress to the metal electrode layer 130 to induce a forward bias of the MIS structure 10. As shown in FIG. 17B, plural BD paths are formed.

Figure 18:
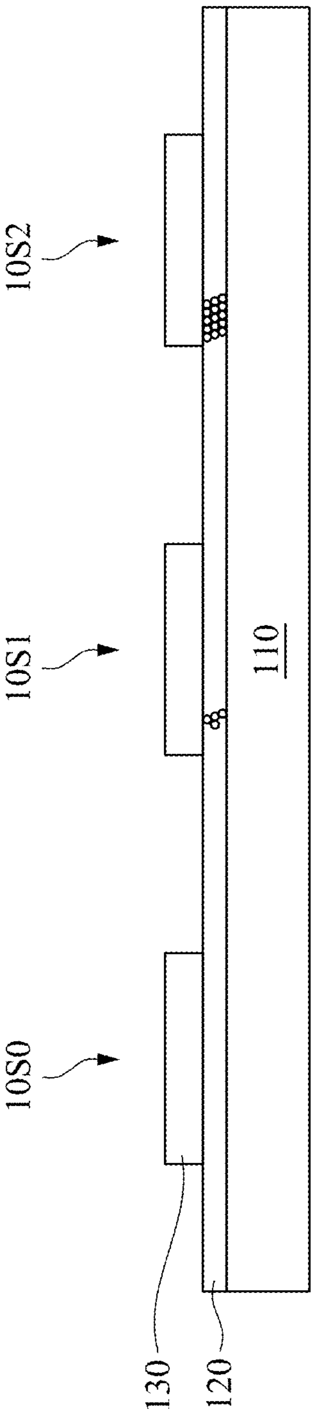
FIG. 18 illustrate a memory device include MIS structures programed at three different states in accordance with some embodiments of the present disclosure.

FIG. 18 illustrate a memory device include MIS structures programed at three different states in accordance with some embodiments of the present disclosure. Each of the three MIS structures 10S0, 10S1, 10S2 include a continuous insulating layer 120 having a bottom surface in contact with the semiconductor layer 110 (or the semiconductor substrate 110) and a top surface in contact with the metal electrode layer 130. The continuous insulating layers 120 of the three MIS structures 10S0, 10S1, 10S2 have substantially the same thickness and the same material. By aforementioned first-state and second-state breakdown processes, the numbers of breakdown paths in the continuous insulating layers 120 of the three MIS structures 10S0, 10S1, 10S2 are different, such that the three MIS structures 10S0, 10S1, 10S2 are at three different resistance states. For example, the MIS structures 10S0, 10S1, 10S2 are respectively at State 0, State 1, and State 2. Other details of the present embodiments are similar to those illustrated above, and therefore not repeated herein.

Figure 19A:
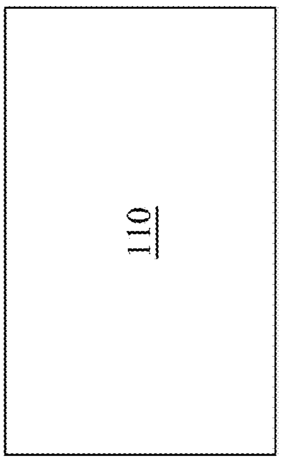
FIGS. 19A-19D illustrate various stages of fabricating a MIS structure in accordance with some embodiments of the present disclosure.
Figure 19B:
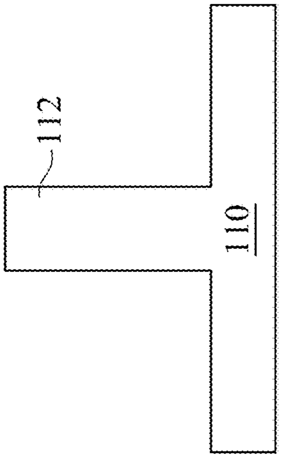

FIGS. 19A-19D illustrate various stages of fabricating a MIS structure in accordance with some embodiments of the present disclosure. In FIG. 19A, a semiconductor layer 110 is provided. In some embodiments, the semiconductor layer 110 may be made of Si, Ge, GaAs, $MoS_2$, or other suitable semiconductor material. The semiconductor layer 110 may be a p-type semiconductor layer or a n-type semiconductor layer. In FIG. 19B, the semiconductor layer 200 is patterned to form a fin structure 112 protruding over the semiconductor layer 110. In some embodiments, the fin structure 112 may be formed by, for example, forming a patterned mask over the semiconductor layer 110, etching portions of the semiconductor layer 110 exposed by the patterned mask, and then removing the patterned mask, in which the un-etched portion of the semiconductor layer 110 protruding over the semiconductor layer 110 can be referred to as the fin structure 112.

Figure 19C:
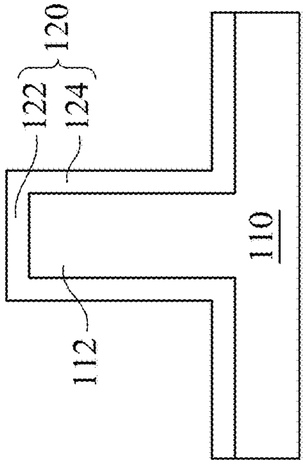

In FIG. 19C, an insulating layer 120 is deposited over the semiconductor layer 110 and lining the fin structure 112. In some embodiments, the insulating layer 120 may include a horizontal portion 122 over a top surface of the fin structure 112 and vertical portions 124 on opposite sidewalls of the fin structure 112. The insulating layer 120 may be made of dielectric material, such as silicon oxide (SiO2), aluminum oxide ($Al2O_3$), hafnium oxide ($HfO_2$), hBN, or other suitable dielectric material. In some embodiments, the insulating layer 120 can be deposited using suitable process, such as chemical vapor deposition (CVD), physical vapor deposition (PVD), atomic layer deposition (ALD), or the like.

Figure 19D:
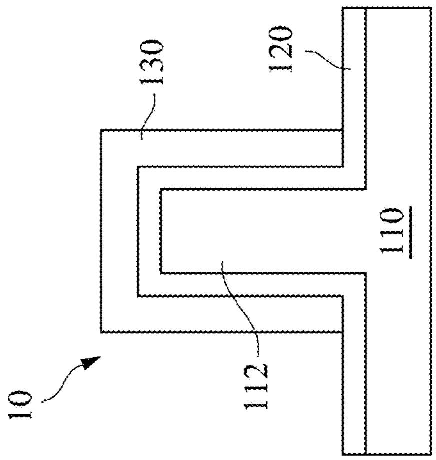

In FIG. 19D, a metal electrode layer 130 is formed over the insulating layer 120. In some embodiments, the metal electrode layer 130 may be made of metal, such as aluminum (Al), titanium nitride (TiN), gold (Au), tungsten (W), or other suitable metal. The metal electrode layer 130 may be formed by, for example, depositing a metal layer over the insulating layer 120, and then patterning the metal layer according to a predetermined pattern. As a result, a MIS structure 10' is formed.

Figure 19E:
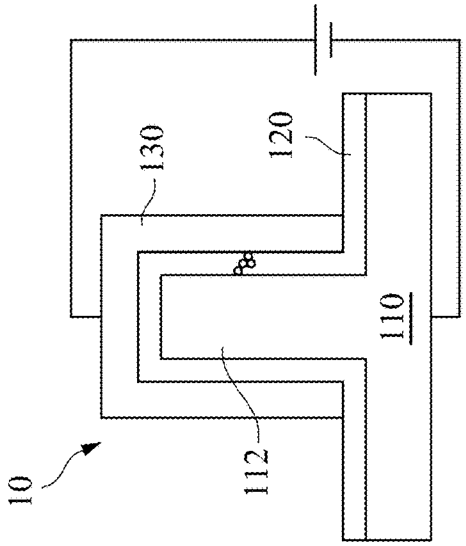
FIGS. 19E and 19F illustrate programing operations performed on the MIS structure having a p-type semiconductor layer in accordance with some embodiments of the present disclosure.
Figure 19F:
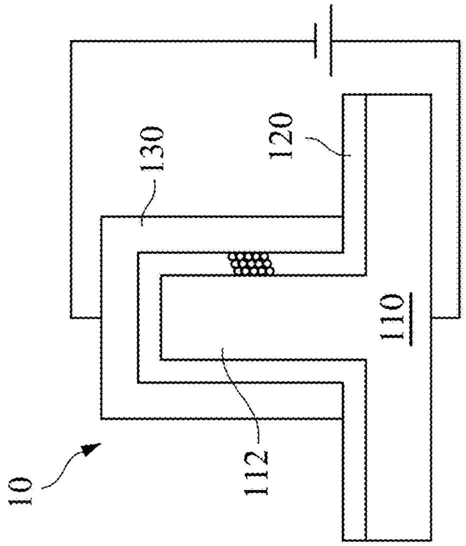

FIGS. 19E and 19F illustrate programing operations performed on the MIS structure having a p-type semiconductor layer in accordance with some embodiments of the present disclosure. In FIG. 19E where the semiconductor layer 110 is a p-type semiconductor layer, a first-state breakdown process is performed to the MIS structure 10 by applying a positive voltage stress to the metal electrode layer 130 to induce a reverse bias of the MIS structure 10. As shown in FIG. 19E, a BD path is formed. In FIG. 19F where the semiconductor layer 110 is a p-type semiconductor layer, a second-state breakdown process is performed to the MIS structure 10 by applying a negative voltage stress to the metal electrode layer 130 to induce a forward bias of the MIS structure 10. As shown in FIG. 19F, plural BD paths are formed.

Figure 20:
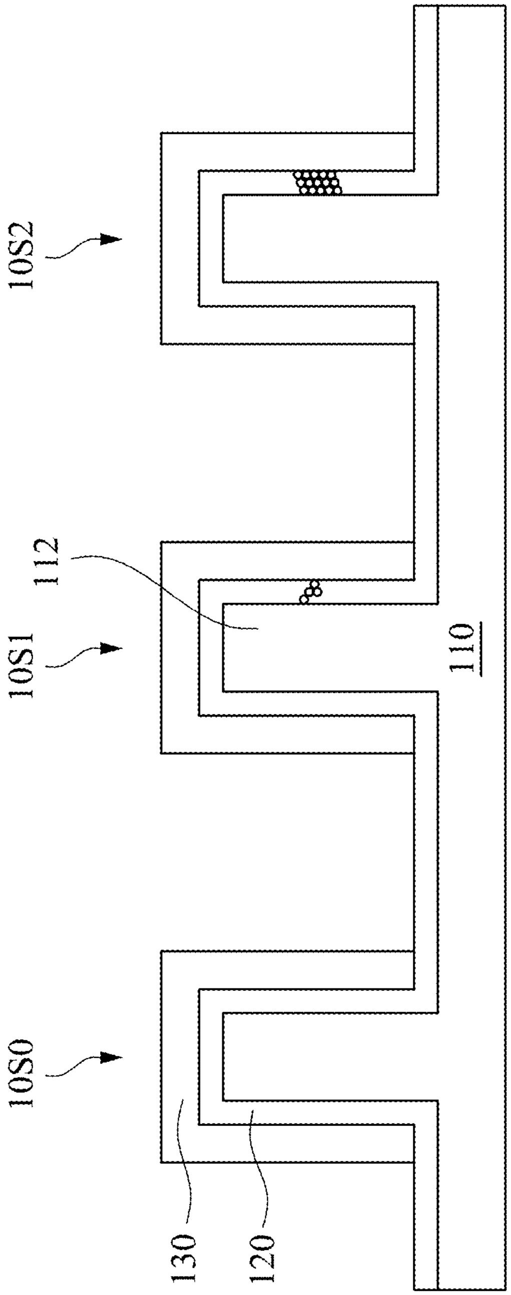
FIG. 20 illustrate a memory device include MIS structures programed at three different states in accordance with some embodiments of the present disclosure.

FIG. 20 illustrate a memory device include MIS structures programed at three different states in accordance with some embodiments of the present disclosure. Each of the three MIS structures 10S0, 10S1, 10S2 include a continuous insulating layer 120 having a bottom surface in contact with the fin structure 112 and a top surface in contact with the metal electrode layer 130. The continuous insulating layers 120 of the three MIS structures 10S0, 10S1, 10S2 have substantially the same thickness and the same material. By aforementioned first-state and second-state breakdown processes, the numbers of breakdown paths in the continuous insulating layers 120 of the three MIS structures 10S0, 10S1, 10S2 are different, such that the three MIS structures 10S0, 10S1, 10S2 are at three different resistance states. For example, the MIS structures 10S0, 10S1, 10S2 are respectively at State 0, State 1, and State 2. Other details of the present embodiments are similar to those illustrated above, and therefore not repeated herein.

Figure 21A:
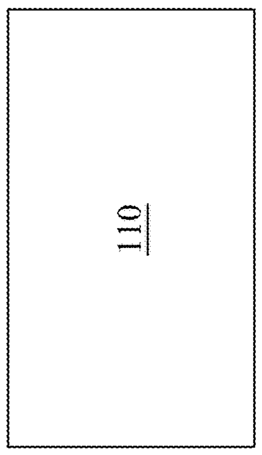
FIGS. 21A-21D illustrate various stages of fabricating a MIS structure in accordance with some embodiments of the present disclosure.

FIGS. 21A-21D illustrate various stages of fabricating a MIS structure in accordance with some embodiments of the present disclosure. In FIG. 21A, a semiconductor layer 110 is provided. In some embodiments, the semiconductor layer 110 may be made of Si, Ge, GaAs, $MoS_2$, or other suitable semiconductor material. The semiconductor layer 110 may be a p-type semiconductor layer or a n-type semiconductor layer.

Figure 21B:
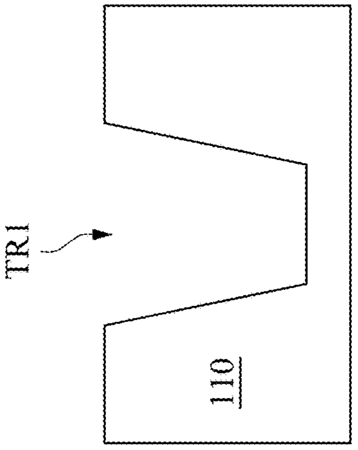

In FIG. 21B, the semiconductor layer 110 is patterned to form a recess TR1 in the semiconductor layer 110. In some embodiments, the recess TR1 may be formed by, for example, forming a patterned mask over the semiconductor layer 110, etching the semiconductor layer 110 through an opening of the patterned mask to form the trench TR1 in the semiconductor layer 110, and then removing the patterned mask.

Figure 21C:
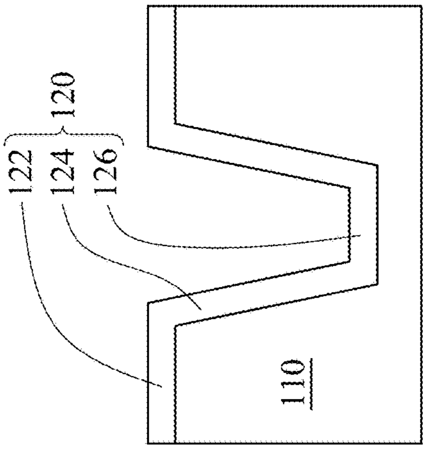

In FIG. 21C, an insulating layer 120 is deposited over the semiconductor layer 110 and lining the trench TR1. In some embodiments, the insulating layer 120 may include a top portion 122 over a top surface of the semiconductor layer 110, inclined portions 124 on opposite sidewalls of the recess TR1, and a horizontal portion 126 lining a bottom surface of the recess TR1. The insulating layer 120 may be made of dielectric material, such as silicon oxide ($SiO_2$), aluminum oxide ($Al_2O_3$), hafnium oxide ($HfO_2$), hBN, or other suitable dielectric material. In some embodiments, the insulating layer 120 can be deposited using suitable process, such as chemical vapor deposition (CVD), physical vapor deposition (PVD), atomic layer deposition (ALD), or the like.

Figure 21D:
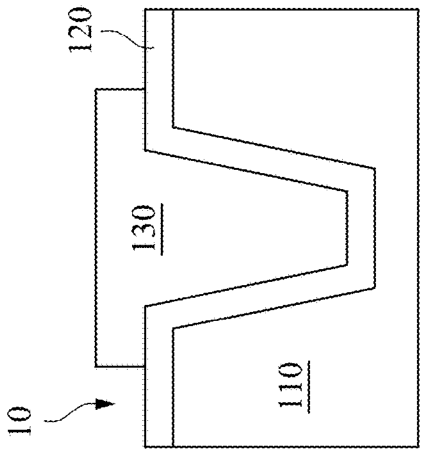

In FIG. 21D, a metal electrode layer 130 is formed filling the recess TR1 and over the insulating layer 120. In some embodiments, the metal electrode layer 130 may be made of metal, such as aluminum (Al), titanium nitride (TiN), gold (Au), tungsten (W), or other suitable metal. The metal electrode layer 130 may be formed by, for example, depositing a metal layer filling the recess TR1 and over the insulating layer 120, and then patterning the metal layer according to a predetermined pattern. As a result, a MIS structure 10 is formed.

Figure 21E:
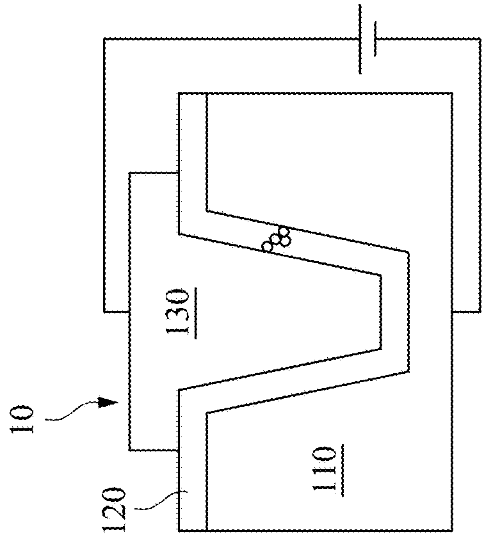
FIGS. 21E and 21F illustrate programing operations performed on the MIS structure having a p-type semiconductor layer in accordance with some embodiments of the present disclosure.
Figure 21F:
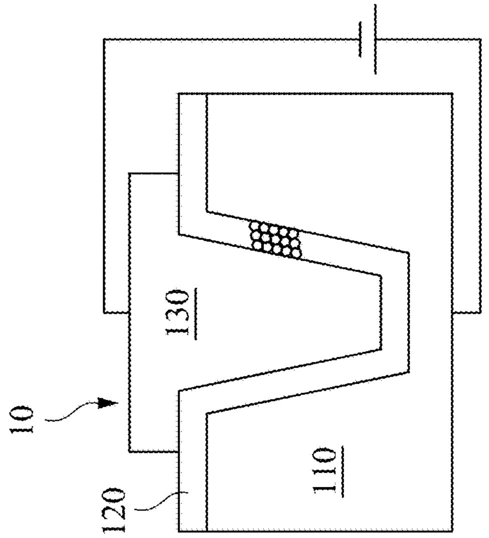

FIGS. 21E and 21F illustrate programing operations performed on the MIS structure having a p-type semiconductor layer in accordance with some embodiments of the present disclosure. In FIG. 21E where the semiconductor layer 110 is a p-type semiconductor layer, a first-state breakdown process is performed to the MIS structure 10 by applying a positive voltage stress to the metal electrode layer 130 to induce a reverse bias of the MIS structure 10. As shown in FIG. 21E, a BD path is formed. In FIG. 21F where the semiconductor layer 110 is a p-type semiconductor layer, a second-state breakdown process is performed to the MIS structure 10 by applying a negative voltage stress to the metal electrode layer 130 to induce a forward bias of the MIS structure 10. As shown in FIG. 21F, plural BD paths are formed.

Figure 22:
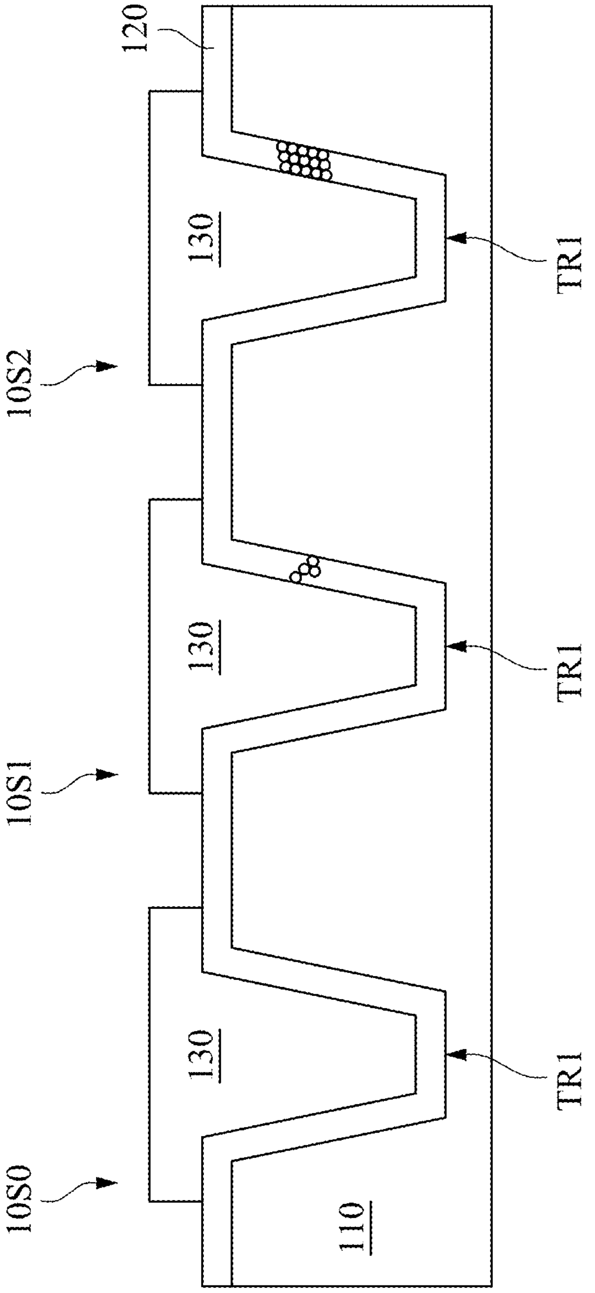
FIG. 22 illustrate a memory device include MIS structures programed at three different states in accordance with some embodiments of the present disclosure.

FIG. 22 illustrate a memory device include MIS structures programed at three different states in accordance with some embodiments of the present disclosure. Each of the three MIS structures 10S0, 10S1, 10S2 include a continuous insulating layer 120 having a bottom surface in contact with the trench TR1 and a top surface in contact with the metal electrode layer 130. The continuous insulating layers 120 of the three MIS structures 10S0, 10S1, 10S2 have substantially the same thickness and the same material. By aforementioned first-state and second-state breakdown processes, the numbers of breakdown paths in the continuous insulating layers 120 of the three MIS structures 10S0, 10S1, 10S2 are different, such that the three MIS structures 10S0, 10S1, 10S2 are at three different resistance states. For example, the MIS structures 10S0, 10S1, 10S2 are respectively at State 0, State 1, and State 2. Other details of the present embodiments are similar to those illustrated above, and therefore not repeated herein.

FIGS. 23A-23D illustrate various stages of fabricating a MIS structure in accordance with some embodiments of the present disclosure. In some embodiments, the semiconductor layer 100 may be made of Si, Ge, GaAs, $MoS_2$, or other suitable semiconductor material. In the embodiments of FIGS. 23A-23D, the semiconductor layer 400 is a p-type semiconductor layer. That is, the semiconductor layer 400 may be doped with boron (B), gallium (Ga), indium (In), aluminium (Al), or the like. The semiconductor layer 110 may be a p-type semiconductor layer or a n-type semiconductor layer.

Figure 23A:
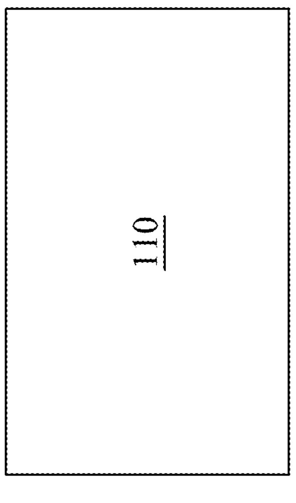
FIGS. 23A-23D illustrate various stages of fabricating a MIS structure in accordance with some embodiments of the present disclosure.
Figure 23B:
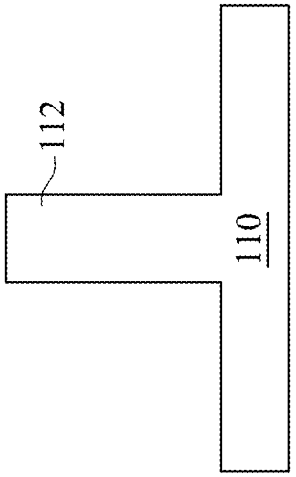

In FIG. 23B, the semiconductor layer 110 is patterned to form a fin structure 112 protruding over the semiconductor layer 110. In some embodiments, the fin structure 112 may be formed by, for example, forming a patterned mask over the semiconductor layer 110, etching portions of the semiconductor layer 110 exposed by the patterned mask, and then removing the patterned mask, in which the un-etched portion of the semiconductor layer 110 protruding over the semiconductor layer 110 can be referred to as the fin structure 112.

Figure 23C:
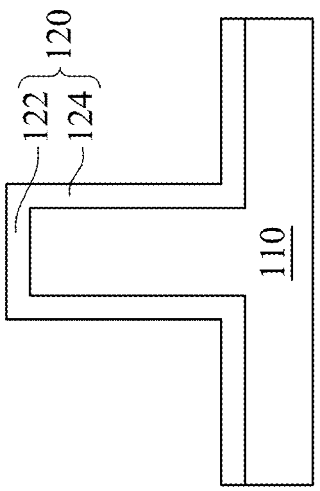

In FIG. 23C, an insulating layer 120 is deposited over the semiconductor layer 110 and lining the fin structure 112. In some embodiments, the insulating layer 120 may include a horizontal portion 122 over a top surface of the fin structure 112, and vertical portions 124 on opposite sidewalls of the fin structure 112. The insulating layer 120 may be made of dielectric material, such as silicon oxide (SiO2), aluminum oxide ($Al_2O_3$), hafnium oxide ($HfO_2$), hBN, or other suitable dielectric material. In some embodiments, the insulating layer 120 can be deposited using suitable process, such as chemical vapor deposition (CVD), physical vapor deposition (PVD), atomic layer deposition (ALD), or the like.

Figure 23D:
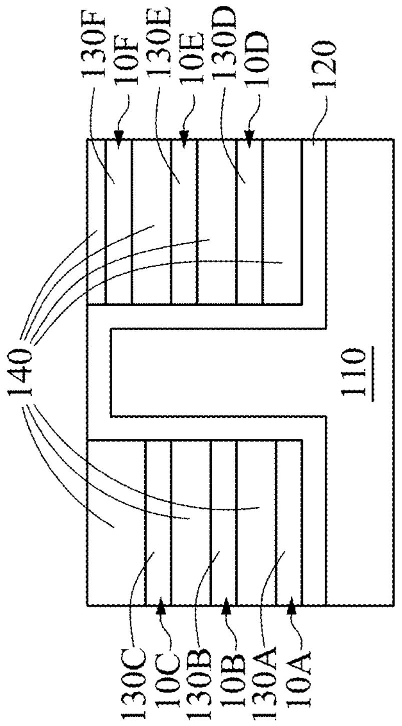

In FIG. 23D, a plurality of metal electrode layers 130A, 130B, 130C, 130D, 130E, and 130F are formed over the semiconductor layer 110 and laterally adjacent to the fin structure 112. In greater detail, a stack of the metal electrode layers 130A, 130B, and 130C is formed on one side of the fin structure 112 and spaced apart from the fin structure by the insulating layer 120, and a stack of the metal electrode layers 130D, 130E, and 130F is formed on another side of the fin structure 112 and spaced apart from the fin structure by the insulating layer 120.

Moreover, dielectric layers 140 are also formed to vertically separate and electrically isolate the metal electrode layers 130A, 130B, 130C, 130D, 130E, and 130F from each other. In some embodiments, sidewalls of the metal electrode layers 130A, 130B, 130C, 130D, 130E, and 130F are in contact with the insulating layer 120. In some embodiments, bottom surface of the metal electrode layer 130A may be in contact with the insulating layer 120. In some embodiments, the bottom surface of the metal electrode layer 130D may be separated from the insulating layer 120 through a dielectric layer 140.

After the formation of the metal electrode layers 130A, 130B, 130C, 130D, 130E, and 130F, a MIS structure 10 is formed, in which the MIS structure 10 may include a plurality of MIS cells 10A, 10B, 10C. 10D, 10E, and 10F. For example, the metal electrode layer 130A, the insulating layer 120, and the fin structure 112 may collectively serve as the MIS cell 10A. The metal electrode layer 130B, the insulating layer 120, and the fin structure 112 may collectively serve as the MIS cell 10B. The metal electrode layer 130C, the insulating layer 120, and the fin structure 112 may collectively serve as the MIS cell 10C. The metal electrode layer 120D, the insulating layer 120, and the fin structure 112 may collectively serve as the MIS cell 10D. The metal electrode layer 130E, the insulating layer 120, and the fin structure 112 may collectively serve as the MIS cell 10E. The metal electrode layer 130F, the insulating layer 120, and the fin structure 112 may collectively serve as the MIS cell 10F.

Figure 23F:
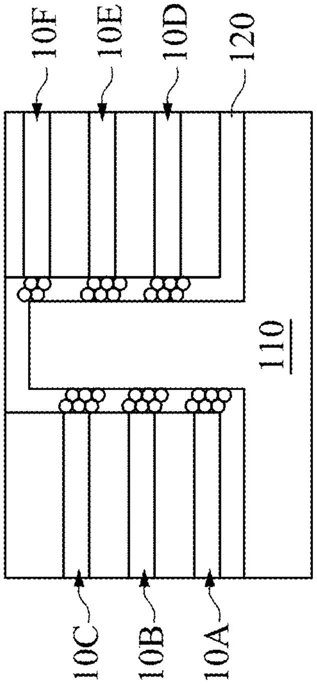
FIGS. 23E and 23F illustrate programing operations performed on the MIS structure in accordance with some embodiments of the present disclosure.
Figure 23E:
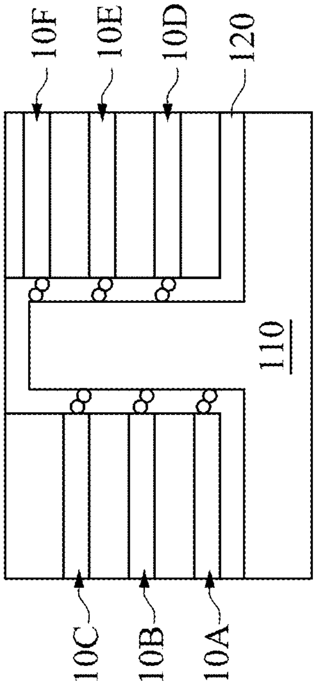

FIGS. 23E and 23F illustrate programing operations performed on the MIS structure in accordance with some embodiments of the present disclosure. In FIG. 23E, a first-state breakdown process is performed to the MIS cells 10A, 10B, 10C, 10D, 10E, and 10F by applying a positive or negative voltage stress (depending on the p-type or n-type polarity of the semiconductor layer 110) to the metal electrode layer 130 to induce a reverse bias of the MIS cells 10A, 10B, 10C, 10D, 10E, and 10F. As shown in FIG. 23E, a BD path is formed. In FIG. 23F, a second-state breakdown process is performed to the MIS cells 10A, 10B, 10C, 10D, 10E, and 10F by applying a negative or positive voltage stress (depending on the p-type or n-type polarity of the semiconductor layer 110) to the metal electrode layer 130 to induce a forward bias of the MIS cells 10A, 10B, 10C, 10D, 10E, and 10F. As shown in FIG. 23F, plural BD paths are formed.

In FIGS. 16A-17B, 19E, 19F, 21E, 21F, 23E, and 23F the positive and the negative voltage stresses may be, as discussed above, a ramped voltage (e.g., without current compliance), a ramped voltage with current compliance, a constant voltage (e.g., without current compliance), a constant voltage with current compliance, a sweeping voltage (e.g., without current compliance), a sweeping voltage with current compliance, a constant current (e.g., without voltage compliance), a constant current with voltage compliance, or a sweeping current. The mechanism of breakdown has been discussed above, and thus relevant details will not be repeated for brevity.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. Embodiments of the present disclosure provide a method including performing polarity dependent dielectric breakdown on MIS device, thereby achieving three current levels for an antifuse cell. The antifuse cell is CMOS logic compatible and has shown large current window.

According to some embodiments of the present disclosure, a method for forming a memory device is provided. The method includes forming a first metal-insulator-semiconductor (MIS) structure and a second MIS structure, wherein each of the first and second MIS structures comprises a semiconductor layer, an insulating layer over the semiconductor layer, and a metal electrode layer over the insulating layer; performing a first breakdown process to the first MIS structure; performing a second breakdown process to the second MIS structure; performing a first read operation by supplying a reading voltage pulse to the metal electrode layer of the first MIS structure and detecting a first read current flowing through the first MIS structure; and performing a second read operation by supplying the reading voltage pulse to the metal electrode layer of the second MIS structure and detecting a second read current flowing through the second MIS structure, wherein the second read current is greater than the first read current.

According to some embodiments of the present disclosure, a method for forming a memory device is provided. The method includes forming a first MIS structure and a second MIS structure over a semiconductor substrate; reverse biasing the first MIS structure to induce a first flat band voltage shift in the first MIS structure; forward biasing the second MIS structure to induce a second flat band voltage shift in the second MIS structure, wherein an absolute value of the second flat band voltage shift is greater than an absolute value of the first flat band voltage shift; detecting a first read current flowing through the first MIS structure under a reading voltage pulse; and detecting a second read current flowing through the second MIS structure under the reading voltage pulse, wherein the second read current is greater than the first read current.

According to some embodiments of the present disclosure, a memory device includes a semiconductor substrate, a first MIS structure, a second MIS structure, and a third MIS structure. The first MIS structure comprises a first continuous insulating layer over and in contact with the semiconductor substrate and a first metal electrode layer over and in contact with the first continuous insulating layer. The second MIS structure comprises a second continuous insulating layer over and in contact with the semiconductor substrate and a second metal electrode layer over and in contact with the second continuous insulating layer. The third MIS structure comprises a third continuous insulating layer over and in contact with the semiconductor substrate and a third metal electrode layer over and in contact with the third continuous insulating layer, wherein the first to third continuous insulating layer have substantially the same thickness and the same material, and the first to third MIS structures are at three different resistance states.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first metal-insulator-semiconductor (MIS) structure and a second MIS structure, wherein each of the first and second MIS structures comprises a semiconductor layer, an insulating layer over the semiconductor layer, and a metal electrode layer over the insulating layer;

performing a first breakdown process to the first MIS structure, wherein the first breakdown process comprises providing a first first-polarity voltage stress to the metal electrode layer of the first MIS structure;

performing a second breakdown process to the second MIS structure, wherein the second breakdown process comprises providing a second-polarity voltage stress to the metal electrode layer of the second MIS structure, and a polarity of the second-polarity voltage stress is opposite to a polarity of the first first-polarity voltage stress;

performing a first read operation by supplying a reading voltage pulse to the metal electrode layer of the first MIS structure and detecting a first read current flowing through the first MIS structure; and performing a second read operation by supplying the reading voltage pulse to the metal electrode layer of the second MIS structure and detecting a second read current flowing through the second MIS structure, wherein the second read current is greater than the first read current.

2. The method of claim 1, wherein the first-polarity voltage stress and the second-polarity voltage stress are ramped voltages.

3. The method of claim 2, wherein an absolute value of a voltage step of the ramped voltages is less than an absolute value of the reading voltage pulse.

4. The method of claim 1, wherein the semiconductor layer is a p-type semiconductor layer, the first-polarity voltage stress is a positive voltage stress, and the second-polarity voltage stress is a negative voltage stress.

5. The method of claim 1, wherein the second breakdown process comprises:

providing a second first-polarity voltage stress to the metal electrode layer of the second MIS structure, wherein the second-polarity voltage stress is provided to the metal electrode layer of the second MIS structure after providing the second first-polarity voltage stress to the metal electrode layer of the second MIS structure, and a polarity of the second-polarity voltage stress is opposite to a polarity of the first first-polarity voltage stress and the second first-polarity voltage stress.

6. The method of claim 5, wherein the semiconductor layer is a p-type semiconductor layer, the first and second first-polarity voltage stresses are positive voltage stresses, and the second-polarity voltage stress is a negative voltage stress.

7. The method of claim 1, wherein the first breakdown process comprises reverse biasing the semiconductor layer.

8. The method of claim 1, wherein the second breakdown process comprises forward biasing the semiconductor layer.

9. The method of claim 1, wherein the insulating layer is a single continuous layer having a bottom surface and a top surface in contact with the semiconductor layer and the metal electrode layer, respectively.

10. The method of claim 1, wherein the insulating layers of the first and second MIS structures have substantially the same thickness.

11. A method, comprising:

forming a first metal-insulator-semiconductor (MIS) structure and a second MIS structure, wherein each of the first and second MIS structures comprises a semiconductor layer, an insulating layer of a dielectric material over the semiconductor layer, and a metal electrode layer over the insulating layer;

performing a first breakdown process to the first MIS structure, wherein the first breakdown process comprises providing a first first-polarity voltage stress to the metal electrode layer of the first MIS structure;

performing a second breakdown process to the second MIS structure, wherein the second breakdown process comprises providing a second-polarity voltage stress to the metal electrode layer of the second MIS structure, and a polarity of the second-polarity voltage stress is opposite to a polarity of the first first-polarity voltage stress;

performing a first read operation by supplying a reading voltage pulse to the metal electrode layer of the first MIS structure and detecting a first read current flowing through the first MIS structure; and performing a second read operation by supplying the reading voltage pulse to the metal electrode layer of the second MIS structure and detecting a second read current flowing through the second MIS structure, wherein the second read current is greater than the first read current.

12. The method of claim 11, wherein the first-polarity voltage stress and the second-polarity voltage stress are ramped voltages.

13. The method of claim 12, wherein an absolute value of a voltage step of the ramped voltages is less than an absolute value of the reading voltage pulse.

14. The method of claim 11, wherein the semiconductor layer is a p-type semiconductor layer, the first-polarity voltage stress is a positive voltage stress, and the second-polarity voltage stress is a negative voltage stress.

15. The method of claim 11, wherein the second breakdown process comprises:

providing a second first-polarity voltage stress to the metal electrode layer of the second MIS structure, wherein the second-polarity voltage stress is provided to the metal electrode layer of the second MIS structure after providing the second first-polarity voltage stress to the metal electrode layer of the second MIS structure, and a polarity of the second-polarity voltage stress is opposite to a polarity of the first first-polarity voltage stress and the second first-polarity voltage stress.

16. The method of claim 15, wherein the semiconductor layer is a p-type semiconductor layer, the first and second first-polarity voltage stresses are positive voltage stresses, and the second-polarity voltage stress is a negative voltage stress.

17. The method of claim 11, wherein the first breakdown process comprises reverse biasing the semiconductor layer.

18. A method, comprising:

forming a first metal-insulator-semiconductor (MIS) structure and a second MIS structure, wherein each of the first and second MIS structures comprises a semiconductor layer, an insulating layer over the semiconductor layer, and a metal electrode layer over the insulating layer, wherein the semiconductor layer is a p-type semiconductor layer;

performing a first breakdown process to the first MIS structure, wherein the first breakdown process comprises providing a first first-polarity voltage stress to the metal electrode layer of the first MIS structure;

performing a second breakdown process to the second MIS structure, wherein the second breakdown process comprises providing a second-polarity voltage stress to the metal electrode layer of the second MIS structure, and a polarity of the second-polarity voltage stress is opposite to a polarity of the first first-polarity voltage stress;

performing a first read operation by supplying a reading voltage pulse to the metal electrode layer of the first MIS structure and detecting a first read current flowing through the first MIS structure; and performing a second read operation by supplying the reading voltage pulse to the metal electrode layer of the second MIS structure and detecting a second read current flowing through the second MIS structure, wherein the second read current is greater than the first read current.

19. The method of claim 18, wherein the second breakdown process comprises forward biasing the semiconductor layer.

20. The method of claim 18, wherein the insulating layer is a single continuous layer having a bottom surface and a top surface in contact with the semiconductor layer and the metal electrode layer, respectively.

* * * * *